United States Patent
Seo et al.

(10) Patent No.: US 10,014,356 B2
(45) Date of Patent: Jul. 3, 2018

(54) ORGANIC LIGHT-EMITTING DIODE DISPLAY

(71) Applicant: Samsung Display Co., Ltd., Yongin-si, Gyeonggi-do (KR)

(72) Inventors: Tae An Seo, Hwaseong-si (KR); Ju Chan Park, Seoul (KR); Jin Hwan Choi, Seoul (KR); Tae Woong Kim, Seongnam-si (KR); Bo Ik Park, Seongnam-si (KR); Young Gug Seol, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/255,710

(22) Filed: Sep. 2, 2016

(65) Prior Publication Data

US 2017/0104046 A1    Apr. 13, 2017

(30) Foreign Application Priority Data

Oct. 8, 2015 (KR) .................. 10-2015-0141626

(51) Int. Cl.
*H01L 27/32* (2006.01)
*H01L 51/00* (2006.01)

(52) U.S. Cl.
CPC ...... *H01L 27/3248* (2013.01); *H01L 27/3258* (2013.01); *H01L 27/3262* (2013.01);
(Continued)

(58) Field of Classification Search
CPC ............ H01L 27/3248; H01L 27/3258; H01L 27/3262; H01L 27/3265; H01L 2251/5338
See application file for complete search history.

(56) References Cited

U.S. PATENT DOCUMENTS 7,381,596 B2 * 6/2008 Chen ............... H01L 27/124
257/E21.561
9,293,457 B2 * 3/2016 Tsuchiya ........... H01L 23/528
(Continued)

FOREIGN PATENT DOCUMENTS

CN    104282769 A    1/2015
JP    2007-288078 A   11/2007
(Continued)

OTHER PUBLICATIONS

Extended European Search Report dated Feb. 27, 2017 for European Patent Application No. EP 16 192 940.1 which corresponds to subject U.S. Appl. No. 15/255,710.

*Primary Examiner* — Allan R Wilson
(74) *Attorney, Agent, or Firm* — Knobbe Martens Olson & Bear LLP

(57) ABSTRACT

An organic light-emitting diode display is disclosed. In one aspect, the display includes a substrate having a flexible portion configured to bend or fold, a semiconductor positioned over the substrate, and a gate insulating layer positioned over the semiconductor and having an opening. The display also includes an interlayer insulating layer positioned over the gate insulating layer, a portion of the interlayer insulating layer positioned within the opening. The display further includes a gate electrode positioned between the gate insulating layer and the interlayer insulating layer and overlapping the semiconductor in the depth dimension of the OLED display. A source electrode and a drain electrode are positioned over the interlayer insulating layer and connected to the semiconductor.

28 Claims, 16 Drawing Sheets

(52) U.S. Cl.
CPC ...... *H01L 27/3265* (2013.01); *H01L 51/0097* (2013.01); *H01L 2251/5338* (2013.01)

(56) References Cited

U.S. PATENT DOCUMENTS

| | | |
|---|---|---|
| 2005/0101062 A1 | 5/2005 | You |
| 2010/0001287 A1 | 1/2010 | Ahn et al. |
| 2013/0200375 A1 | 8/2013 | Yamazaki |
| 2014/0353629 A1 | 12/2014 | Jin |
| 2015/0001487 A1* | 1/2015 | Kwon ................. H01L 27/1259 257/40 |
| 2015/0041769 A1 | 2/2015 | Kim et al. |
| 2015/0263312 A1 | 9/2015 | Kanegae |
| 2016/0056225 A1* | 2/2016 | Lee .................... H01L 27/3279 257/40 |
| 2016/0099300 A1* | 4/2016 | Lee .................... H01L 27/3265 257/40 |
| 2016/0254285 A1 | 9/2016 | Long et al. |

FOREIGN PATENT DOCUMENTS

| | | |
|---|---|---|
| KR | 10-2005-0051646 A | 6/2005 |
| KR | 10-0615222 B1 | 8/2006 |
| KR | 10-2014-0099164 A | 8/2014 |
| KR | 10-1486038 B1 | 1/2015 |

* cited by examiner

ORGANIC LIGHT-EMITTING DIODE DISPLAY

RELATED APPLICATIONS

This application claims priority to and the benefit of Korean Patent Application No. 10-2015-0141626 filed in the Korean Intellectual Property Office on Oct. 8, 2015, the entire contents of which are incorporated herein by reference.

BACKGROUND

Field

The described technology generally relates to an organic light-emitting diode display.

Description of the Related Technology

Each organic light-emitting diode (OLED) in an OLED display includes two electrodes and an interposed organic emission layer. An electron injected from one electrode and a hole injected from the other electrode are coupled with each other in the organic emission layer to generate an exciton, and the exciton emits energy to emit light.

Such an OLED display includes a matrix of pixels, each pixel including a self-emissive OLED. Each pixel circuit includes multiple transistors for driving the OLED and at least one storage capacitor. The set of thin film transistors (TFTs) typically include at least a switching thin film transistor and a driving thin film transistor.

Each thin film transistor includes a gate electrode, a semiconductor, a source electrode, and a drain electrode, and an insulating layer can be positioned between the semiconductor and the source and drain electrodes. In this case, the insulating layer can include a contact hole to connect the semiconductor and the source and drain electrodes. When bending or folding the OLED display, the surroundings of the contact hole are vulnerable to external stress such that the insulating layer can be damaged.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to an OLED display that can prevent damage to elements when being bent or folded.

Another aspect is an OLED display including a flexible part that is bent or folded according to an exemplary embodiment. The OLED display includes: a substrate; a semiconductor positioned on the substrate; a gate insulating layer positioned on the semiconductor and including an opening exposing at least part of the semiconductor; an interlayer insulating layer positioned on the gate insulating layer and within the opening; a gate electrode positioned between the gate insulating layer and the interlayer insulating layer and overlapping the semiconductor; and a source electrode and a drain electrode positioned on the interlayer insulating layer and connected to the semiconductor.

The interlayer insulating layer can be made of an organic insulating material.

The gate insulating layer can include the organic insulating material or the inorganic insulating material.

The interlayer insulating layer can include a contact hole exposing at least part of the semiconductor, and the contact hole is positioned within the opening, while the source electrode and the drain electrode can be connected to the semiconductor through the contact hole.

The interlayer insulating layer can have a tapered cross-sectional shape within the contact hole.

A taper angle of the interlayer insulating layer within the contact hole can be greater than 30 degrees and less than 80 degrees.

The source electrode and the drain electrode may not directly contacted with the gate insulating layer.

The thin film transistor including the semiconductor, the gate insulating layer, the interlayer insulating layer, the gate electrode, the source electrode, and the drain electrode can be positioned on the flexible part.

The OLED display can include a display area including a plurality of pixels and a non-display area including a driver generating a signal to drive the pixel to be transmitted to the pixel, and the pixel or the driver can include a thin film transistor made of the semiconductor, the gate insulating layer, the interlayer insulating layer, the gate electrode, the source electrode, and the drain electrode.

The gate insulating layer can include a first gate insulating layer positioned on the semiconductor; and a second gate insulating layer positioned on the first gate insulating layer.

The gate electrode can be positioned between the first gate insulating layer and the second gate insulating layer.

The OLED display can further include: a first capacitor electrode positioned between the first gate insulating layer and the second gate insulating layer; and a second capacitor electrode positioned on the second gate insulating layer and overlapping the first capacitor electrode.

The opening can include: a first opening formed in the first gate insulating layer; and a second opening formed in the second gate insulating layer.

The size of the second opening can be larger than the size of the first opening.

The interlayer insulating layer can include a contact hole exposing at least part of the semiconductor, the contact hole is positioned within the opening, and the source electrode and the drain electrode can be connected to the semiconductor through the contact hole.

The interlayer insulating layer can have a cross-sectional shape of a stepped level difference within the contact hole.

The opening can expose at least part of the upper surface of the semiconductor and the entire side surface of the semiconductor.

The gate insulating layer can have substantially the same pattern as the gate electrode.

The gate insulating layer can include: a first gate insulating layer positioned on the semiconductor; and a second gate insulating layer positioned on the first gate insulating layer.

The gate electrode can be positioned between the first gate insulating layer and the interlayer insulating layer.

The OLED display can further include: a first capacitor electrode positioned between the first gate insulating layer and the second gate insulating layer; and a second capacitor electrode positioned on the second gate insulating layer and overlapping the first capacitor electrode.

The first gate insulating layer can have substantially the same pattern as the gate electrode and the second capacitor electrode.

The second gate insulating layer can have substantially the same pattern as the second capacitor electrode.

The interlayer insulating layer can include a contact hole exposing at least part of the semiconductor, the contact hole is positioned within the opening, and the source electrode and the drain electrode can be connected to the semiconductor through the contact hole.

The interlayer insulating layer can have a cross-sectional shape of a stepped level difference within the contact hole.

Another aspect is an organic light-emitting diode (OLED) display, comprising: a substrate having a flexible portion configured to bend or fold; a semiconductor positioned over the substrate; a gate insulating layer positioned over the semiconductor and having an opening; an interlayer insulating layer positioned over the gate insulating layer, wherein a portion of the interlayer insulating layer is positioned within the opening; a gate electrode positioned between the gate insulating layer and the interlayer insulating layer and overlapping the semiconductor in the depth dimension of the OLED display; and a source electrode and a drain electrode positioned over the interlayer insulating layer and connected to the semiconductor.

In the above OLED display, the interlayer insulating layer comprises an organic insulating material.

In the above OLED display, the gate insulating layer comprises the organic insulating material or an inorganic insulating material.

In the above OLED display, the interlayer insulating layer has a contact hole positioned within the opening, wherein the source and drain electrodes are connected to the semiconductor through the contact hole.

In the above OLED display, the contact hole has a tapered shape.

In the above OLED display, the interlayer insulating layer has a top surface and a sidewall that form a taper angle with respect to each other, wherein the taper angle is greater than about 30 degrees and less than about 80 degrees.

In the above OLED display, the source and drain electrodes do not directly contact the gate insulating layer.

In the above OLED display, the semiconductor, the gate insulating layer, the interlayer insulating layer, the gate electrode, the source electrode, and the drain electrode form a thin film transistor (TFT) positioned over the flexible portion.

The above OLED display further comprises a display area including a plurality of pixels and a non-display area including a driver configured to generate and transmit a signal to drive the pixels, wherein each of the pixels or the driver includes a thin film transistor comprising the semiconductor, the gate insulating layer, the interlayer insulating layer, the gate electrode, the source electrode, and the drain electrode.

In the above OLED display, the gate insulating layer includes: a first gate insulating layer positioned over the semiconductor; and a second gate insulating layer positioned over the first gate insulating layer.

In the above OLED display, the gate electrode is positioned between the first and second gate insulating layers.

The above OLED display further comprises: a first capacitor electrode positioned between the first and second gate insulating layers; and a second capacitor electrode positioned over the second gate insulating layer and overlapping the first capacitor electrode in the depth dimension of the OLED display.

In the above OLED display, the opening includes: a first opening formed in the first gate insulating layer; and a second opening formed in the second gate insulating layer.

In the above OLED display, the second opening is larger than the first opening.

In the above OLED display, the interlayer insulating layer includes a contact hole positioned within the opening, wherein the source and drain electrodes are connected to the semiconductor through the contact hole.

In the above OLED display, the interlayer insulating layer has a step shape within the contact hole.

In the above OLED display, the opening exposes at least part of an upper surface of the semiconductor and an entire side surface of the semiconductor.

In the above OLED display, the gate insulating layer has substantially the same shape as the gate electrode.

In the above OLED display, the gate insulating layer includes: a first gate insulating layer positioned over the semiconductor; and a second gate insulating layer positioned over the first gate insulating layer.

In the above OLED display, the gate electrode is positioned between the first gate insulating layer and the interlayer insulating layer.

The above OLED display further comprises: a first capacitor electrode positioned between the first and second gate insulating layers; and a second capacitor electrode positioned over the second gate insulating layer and overlapping the first capacitor electrode in the depth dimension of the OLED display.

In the above OLED display, the first gate insulating layer has substantially the same shape as the gate electrode and the second capacitor electrode.

In the above OLED display, the second gate insulating layer has substantially the same shape as the second capacitor electrode.

In the above OLED display, the interlayer insulating layer has a contact hole positioned within the opening, wherein the source and drain electrodes are connected to the semiconductor through the contact hole.

In the above OLED display, the interlayer insulating layer has a step shape within the contact hole.

Another aspect is an organic light-emitting diode (OLED) display, comprising: a flexible substrate; a semiconductor formed over the substrate and having a plurality of doped regions at opposing ends of the semiconductor; a gate insulating layer formed over the semiconductor; an interlayer insulating layer formed over the gate insulating layer; and a source electrode and a drain electrode formed over the interlayer insulating layer, wherein the interlayer insulating layer contacts the doped regions via a plurality of openings formed in the gate insulating layer, and wherein the source and drain electrodes respectively contact the doped regions via a plurality of contact holes formed in the interlayer insulating layer.

In the above OLED display, each of the contact holes has a width that increases as a function of distance from the semiconductor.

In the above OLED display, each of the openings has a width that increases as a function of distance from the semiconductor.

According to at least one of the disclosed embodiments, the interlayer insulating layer is positioned within the opening of the gate insulating layer to prevent the insulating layer from being damaged when bending or folding the OLED display.

DETAILED DESCRIPTION OF CERTAIN INVENTIVE EMBODIMENTS

Figure 1:
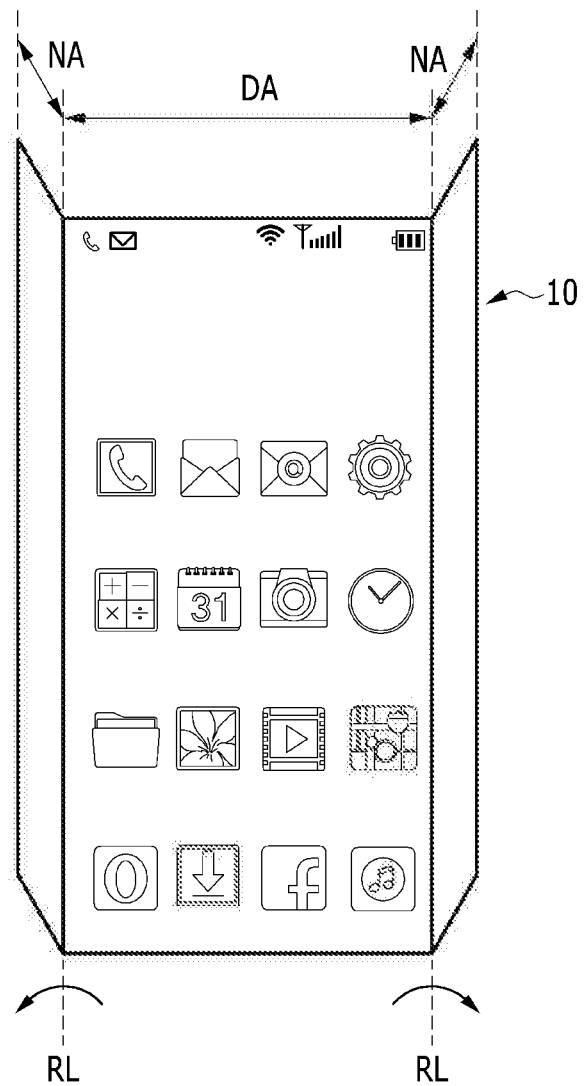
FIG. 1 and FIG. 2 are schematic views showing an OLED display according to an exemplary embodiment.

The described technology will be described more fully hereinafter with reference to the accompanying drawings, in which exemplary embodiments are shown. As those skilled in the art would realize, the described embodiments can be modified in various different ways, all without departing from the spirit or scope of the described technology.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. In contrast, when an element is referred to as being "directly on" another element, there are no intervening elements present. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
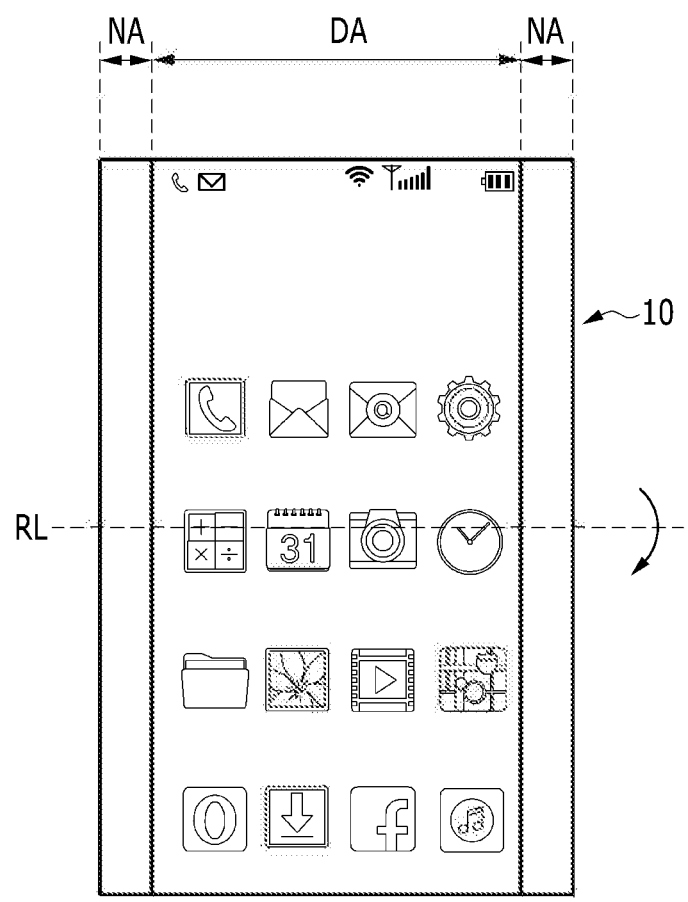

FIG. 1 and FIG. 2 are schematic views showing an OLED display according to an exemplary embodiment.

First, as shown in FIG. 1, the OLED display 10 includes a display area DA and a non-display area NA positioned on both edges of the display area DA.

The display area DA includes a plurality of pixels (not shown), and each pixel displays a predetermined luminance and a color, thereby displaying an image. The non-display area NA includes a driver (not shown) generating a data signal to each pixel. The driver can include both a gate driver to transmit a gate signal to each pixel and a data driver to transmit a data signal. These drivers can be formed on the same substrate as the pixel. Also, the driver can be a type that can be adhered to the substrate formed with the pixel after being formed on a separate circuit board.

Since the non-display area NA is not a region displaying the image, the non-display area NA is generally positioned on one or both edges of the display area DA or to enclose the display area DA. However, the described technology is not limited thereto, and the position of the non-display area NA can be variously arranged.

The OLED display 10 can be bent with respect to a boundary of the display area DA and the non-display area NA as a reference line RL. That is, the non-display area NA positioned on the right and the left with respect to the display area DA can be bent backward. Accordingly, a predetermined stress can be generated on the elements of the part positioned on the boundary of the display area DA and the non-display area NA, that is, the reference line RL.

Next, as shown in FIG. 2, the OLED display 10 can be bent with respect to a transverse line positioned on the center of the OLED display as the reference line RL. That is, the part positioned upward with respect to the reference line RL can be bent downward. In this case, the predetermined stress can be generated on the elements of the part positioned on the reference line RL.

Next, a part of the OLED display 10 according to an exemplary embodiment will be described with reference to FIG. 3.

Figure 3:
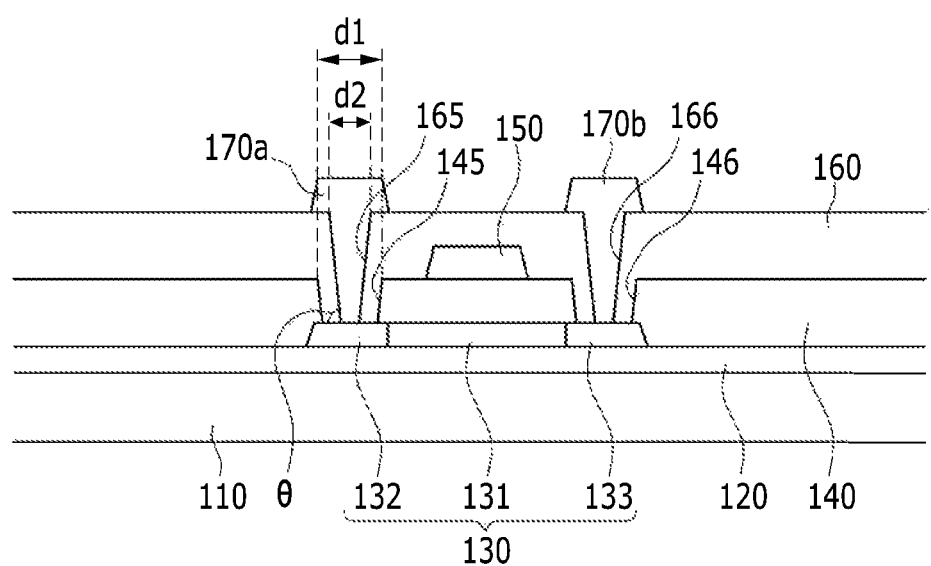
FIG. 3 is a cross-sectional view showing an OLED display according to an exemplary embodiment.

FIG. 3 is a cross-sectional view of an OLED display according to an exemplary embodiment. FIG. 3 shows one thin film transistor of the OLED display according to an exemplary embodiment, and the thin film transistor shown in FIG. 3 can be a driving thin film transistor, a switching thin film transistor, and the like. For convenience, the pixel electrode, the organic emission layer, the common electrode, and the like is omitted.

As shown in FIG. 3, the OLED display includes a substrate 110, a semiconductor 130 positioned on the substrate 110, a gate insulating layer 140 positioned on the semiconductor 130, a gate electrode 150 positioned on the gate insulating layer 140, an interlayer insulating layer 160 positioned on the gate electrode 150, and a source electrode 170a and a drain electrode 170b positioned on the interlayer insulating layer 160.

The substrate 110 can be formed of a material that is capable of being bent or folded, for example, plastic, glass, and the like.

A buffer layer 120 can be further formed on the substrate 110, and in this case, the semiconductor 130 can be positioned on the buffer layer 120. The buffer layer 120 can include a silicon nitride (SiNx) or a silicon oxide (SiOx).

The semiconductor 130 includes a channel 131 that is channel-doped, and contact doping regions 132 and 133 that are positioned at both sides of the channel 131 and are contact-doped. The gate electrode 125 overlaps a part of the channel 131, and the contact doping regions 132 and 133 include a source region 132 and a drain region 133.

The gate insulating layer 140 is formed of an inorganic insulating material such as a silicon nitride (SiNx) or a silicon oxide (SiOx). The gate insulating layer 140 include openings 145 and 146 exposing at least part of the semiconductor 130. The openings 145 and 146 expose the contact doping regions 132 and 133 of the semiconductor 130.

The interlayer insulating layer 160 is formed of an organic insulating material. The interlayer insulating layer 160 is positioned on the gate electrode 150 and the gate insulating layer 140, and is also positioned within the openings 145 and 146 of the gate insulating layer 140. That is, the side surface of the gate insulating layer 140 and the interlayer insulating layer 160 are contacted with each other within the openings 145 and 146. The gate electrode 150 is positioned between the gate insulating layer 140 and the interlayer insulating layer 160.

The interlayer insulating layer 160 includes contact holes 165 and 166 exposing at least part of an upper surface of the semiconductor 130. The contact holes 165 and 166 expose the contact doping regions 132 and 133 of the semiconductor 130.

The contact holes 165 and 166 are positioned within the openings 145 and 146. In this case, the inner wall surface of the interlayer insulating layer 160 of the part where the contact holes 165 and 166 are formed is not contacted with the inner wall surface of the gate insulating layer 140 of the part where the openings 145 and 146 are formed. The inner wall surface of the interlayer insulating layer 160 of the part where the contact holes 165 and 166 are formed is positioned inside than the inner wall surface of the gate insulating layer 140 of the part where the openings 145 and 146 are formed. The size of the openings 145 and 146 is larger than the size of the contact holes 165 and 166. For example, the openings 145 and 146 and the contact holes 165 and 166 can be formed to be substantially circular, and a diameter d1 of the openings 145 and 146 can be larger than a diameter d2 of the contact holes 165 and 166. The shape of the openings 145 and 146 and the contact holes 165 and 166 is not limited to circular, and they can be formed of various shapes. For example, the openings 145 and 146 and the contact holes 165 and 166 can be formed as a polygon such as a quadrilateral. In this case, a length of one side of the openings 145 and 146 can be larger than the length of one side of the contact holes 165 and 166. Also, the area on the plane of the openings 145 and 146 can be larger than the area on the plane of the contact holes 165 and 166. The planar shape of the openings 145 and 146 is similar to the planar shape of the contact holes 165 and 166, and only the sizes can be different. However, the described technology is not limited thereto, and the planar shape of the openings 145 and 146 can be different from the planar shape of the contact holes 165 and 166. For example, the planar shape of the openings 145 and 146 can be quadrilateral, and the planar shape of the contact holes 165 and 166 can be formed as a circle positioned within the quadrilateral. Also, the planar shape of the openings 145 and 146 can be made as the circle and the planar shape of the contact holes 165 and 166 can be formed as the quadrilateral positioned within the circle.

The source electrode 170a and the drain electrode 170b are connected to the semiconductor 130 through the contact holes 165 and 166. The source electrode 170a is connected to the source region 132 of the semiconductor 130, and the drain electrode 170b is connected to the drain region 133 of the semiconductor 130. In this case, the source electrode 170a and the drain electrode 170b are contacted with the interlayer insulating layer 160 in the inner wall of the contact holes 165 and 166. The source electrode 170a and the drain electrode 170b are not contacted with the gate insulating layer 140.

The organic material has a high buffering force compared with the inorganic material, and the source electrode 170a and the drain electrode 170b are not directly contacted with the gate insulating layer 140 formed of the inorganic material and are contacted with the interlayer insulating layer 160 formed of the organic material, thereby relatively increasing the buffering force. As described above, the OLED display can be bent or folded, and in this case, the surroundings of the contact holes 165 and 166 can be vulnerable to the stress. In the present exemplary embodiment, the inside of the openings 145 and 146 of the gate insulating layer 140 is filled with the interlayer insulating layer 160 formed of the organic insulating material to increase the buffering force, thereby preventing the damage due to the bending or the folding.

The interlayer insulating layer 160 can have a tapered cross-sectional shape within the contact holes 165 and 166. However, the described technology is not limited thereto, and the interlayer insulating layer 160 can have the vertical cross-sectional shape within the contact holes 165 and 166.

When the interlayer insulating layer 160 has the tapered cross-sectional shape within the contact holes 165 and 166, the taper angle $\theta$ of the interlayer insulating layer 160 can be made to be from about 30 degrees to about 80 degrees. Also, the taper angle $\theta$ of the interlayer insulating layer 160 can be made to be from about 40 degrees to about 70 degrees. Also, the taper angle $\theta$ of the interlayer insulating layer 160 can be made to be from about 50 degrees to about 60 degrees. The above range can provide an optimum balance between high quality deposition and high aperture ratio. However, depending on embodiments, the taper angle $\theta$ can be made to be less than about 30 degrees or greater than about 90 degrees.

If the taper angle $\theta$ of the interlayer insulating layer 160 is excessively large, when other layers are deposited on the interlayer insulating layer 160, the deposition can occur on the side surface within the contact holes 165 and 166. A wire such as the source electrode 170a and the drain electrode 170b can be formed on the interlayer insulating layer 160, and these wires can be disconnected within the contact holes 165 and 166.

If the taper angle $\theta$ of the interlayer insulating layer 160 is small, a difference between the lower diameter and the upper diameter of the contact holes 165 and 166 is increased. If the taper angle $\theta$ of the interlayer insulating layer 160 decreases while uniformly maintaining the lower diameter of the contact holes 165 and 166, the size of the contact holes 165 and 166 is increased. In this case, in the high resolution OLED display, the size of the contact holes 165 and 166 is large such that the aperture ratio is decreased. If the taper angle $\theta$ of the interlayer insulating layer 160 decreases while uniformly maintaining the upper diameter of the contact holes 165 and 166, the contact area of the source electrode 170a and the drain electrode 170b, and the semiconductor 130, is decreased. In this case, the connection defect between the source electrode 170a and the drain electrode 170b, and the semiconductor 130, can be generated.

The interlayer insulating layer 160 can be made of a photosensitive type and a dry etch type. The interlayer insulating layer of the photosensitive type includes an organic insulating material and a photo-reactive material. The interlayer insulating layer of the photosensitive type can be patterned by a photo-process. The interlayer insulating layer of the dry etch type includes the organic insulating material and does not include the photo-reactive material. The interlayer insulating layer of the dry etch type can be patterned through the photo-process and the etching process.

In a general process, the interlayer insulating layer of the photosensitive type has the taper angle $\theta$ greater than about 30 degrees and less than about 40 degrees, and the interlayer insulating layer of the dry etch type has the taper angle $\theta$ greater than about 70 degrees and less than about 80 degrees. To provide the preferable taper angle of the interlayer insulating layer of the above-described range, it is necessary to design the interlayer insulating layer of the photosensitive type to further increase the taper angle and the interlayer insulating layer of the dry etch type to further decrease the taper angle.

In one OLED display according to an exemplary embodiment, by appropriately controlling the taper angle of the interlayer insulating layer, the problems such as the disconnection defect and the aperture ratio reduction can be solved.

The semiconductor 130, the gate insulating layer 140, the gate electrode 150, the interlayer insulating layer 160, the source electrode 170a, and the drain electrode 170b form one thin film transistor (TFT).

The OLED display according to an exemplary embodiment includes the flexible part that is bent or folded. For example, the reference line RL and the periphery thereof shown in FIG. 1 and FIG. 2 can correspond to the flexible part. The above-described thin film transistor is formed only in the flexible part, and the thin film transistor of a different structure can be formed in other parts. For example, in other parts except for the flexible part, the opening of the gate insulating layer can accord with the contact hole of the interlayer insulating layer, and the source electrode and the drain electrode can also be contacted with the gate insulating layer.

However, the described technology is not limited thereto, and the above-described thin film transistor can be formed on the entire region of the OLED display as well as the flexible part.

In the OLED display according to an exemplary embodiment, as described above, the display area includes the pixels and the non-display area includes the driver. The above-described thin film transistor can be formed in the plurality of pixels and can be formed in the driver. Also, the above-described thin film transistor can be formed in both the pixel and the driver.

Next, the OLED display according to an exemplary embodiment will be described with reference to FIG. 4.

Figure 4:
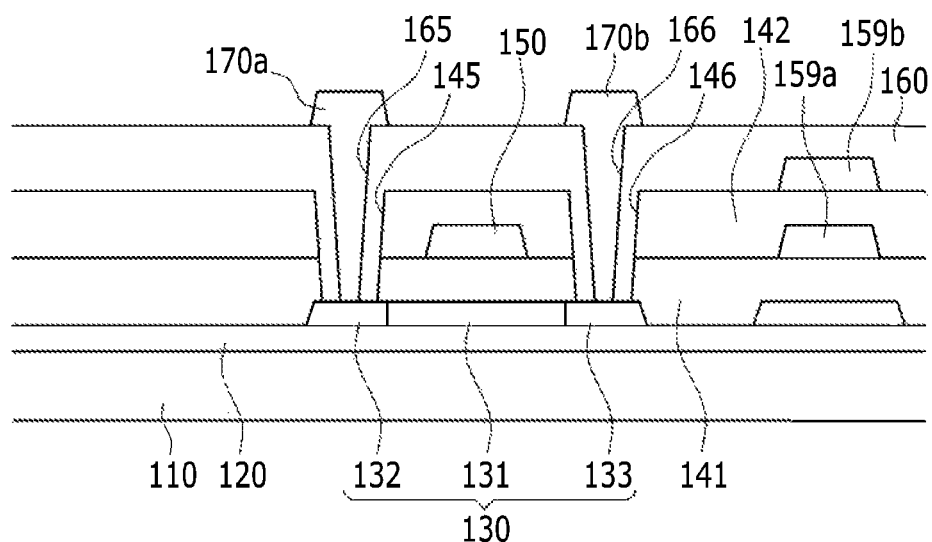
FIG. 4 is a cross-sectional view showing an OLED display according to an exemplary embodiment.

The OLED display according to an exemplary embodiment shown in FIG. 4 is almost the same as the OLED display according to an exemplary embodiment shown in FIG. 3 such that the description thereof is omitted. In the present exemplary embodiment, the gate insulating layer is made of two layers, different from the above exemplary embodiment, and this will be described below.

FIG. 4 is a cross-sectional view showing an OLED display according to an exemplary embodiment. FIG. 4 shows one thin film transistor of the OLED display according to an exemplary embodiment, and the thin film transistor shown in FIG. 4 can be the driving thin film transistor, the switching thin film transistor, and the like. For convenience, the pixel electrode, the organic emission layer, the common electrode, and the like are omitted.

As shown in FIG. 4, the OLED display according to an exemplary embodiment includes the substrate 110, the semiconductor 130 positioned on the substrate 110, a first gate insulating layer 141 positioned on the semiconductor 130, the gate electrode 150 positioned on the first gate insulating layer 141, a second gate insulating layer 142 positioned on the gate electrode 150, the interlayer insulating layer 160 positioned on the second gate insulating layer 142, and the source electrode 170a and the drain electrode 170b positioned on the interlayer insulating layer 160.

The first gate insulating layer 141 and the second gate insulating layer 142 are formed of the inorganic insulating material such as a silicon nitride (SiNx) and a silicon oxide (SiOx). The first gate insulating layer 141 and the second gate insulating layer 142 include the openings 145 and 146 exposing at least part of the upper surface of the semiconductor 130. The openings 145 and 146 expose the contact doping regions 132 and 133 of the semiconductor.

The gate electrode 150 is positioned between the first gate insulating layer 141 and the second gate insulating layer 142.

The interlayer insulating layer 160 is formed of the organic insulating material. The interlayer insulating layer 160 is positioned on the second gate insulating layer 142, and is also positioned within the openings 145 and 146 of the first gate insulating layer 141 and the second gate insulating layer 142. That is, the side surface of the first gate insulating layer 141 and the interlayer insulating layer 160 are contacted within the openings 145 and 146. The interlayer insulating layer 160 is contacted with the side surface of the first gate insulating layer 141 and is not directly contacted with the upper surface of the first gate insulating layer 141. Also, the side surface of the second gate insulating layer 142 and the interlayer insulating layer 160 are contacted within the openings 145 and 146.

The interlayer insulating layer 160 includes the contact holes 165 and 166 exposing at least part of the upper surface of the semiconductor 130. The contact holes 165 and 166 expose the contact doping regions 132 and 133 of the semiconductor 130.

The contact holes 165 and 166 are positioned within the openings 145 and 146. The inner wall surface of the interlayer insulating layer 160 of the part where the contact holes 165 and 166 are formed is positioned inside than the inner wall surface of the first gate insulating layer 141 and the second gate insulating layer 142 of the part where the openings 145 and 146 are formed. The size of the openings 145 and 146 is larger than the size of the contact holes 165 and 166.

The source electrode 170a and the drain electrode 170b are connected to the semiconductor 130 through the contact holes 165 and 166. The source electrode 170a is connected to the source region 132 of the semiconductor 130, and the drain electrode 170b is connected to the drain region 133 of the semiconductor 130. In this case, the source electrode 170a and the drain electrode 170b are contacted with the interlayer insulating layer 160 on the inner wall of the contact holes 165 and 166. The source electrode 170a and the drain electrode 170b are not contacted with the first gate insulating layer 141 or the second gate insulating layer 142.

The organic material has a higher buffering force compared with the inorganic material, and the source electrode 170a and the drain electrode 170b are not directly contacted with the first gate insulating layer 141 or the second gate insulating layer 142 formed of the inorganic material and are contacted with the interlayer insulating layer 160 formed of the organic material, thereby relatively increasing the buffering force. As described above, the OLED display can be bent or folded, and in this case, the periphery of the contact holes 165 and 166 can be vulnerable to stress. In the present exemplary embodiment, the inside of the openings 145 and 146 of the first gate insulating layer 141 and the second gate insulating layer 142 is filled with the interlayer insulating layer 160 formed of the organic insulating material to increase the buffering force, thereby preventing damage due to the bending or the folding.

The interlayer insulating layer 160 can have the tapered cross-sectional shape inside the contact holes 165 and 166. In this case, the taper angle of the interlayer insulating layer 160 can be in the range greater than about 30 degrees and less than about 80 degrees, or greater than about 50 degrees and less than about 60 degrees.

The OLED display according to an exemplary embodiment can further includes a first capacitor electrode 159a positioned between the first gate insulating layer 141 and the second gate insulating layer 142 and a second capacitor electrode 159b positioned on the second gate insulating layer 142.

The first capacitor electrode 159a and the second capacitor electrode 159b can overlap each other. The second gate insulating layer 142 is positioned between the first capacitor electrode 159a and the second capacitor electrode 159b. That is, two electrodes 159a and 159b are overlapped with each other via the second gate insulating layer 142 formed of the insulating material therebetween, thereby forming a capacitor. In this case, the second gate insulating layer 142 serves as a dielectric material.

Next, the OLED display according to an exemplary embodiment will be described with reference to FIG. 5.

Figure 5:
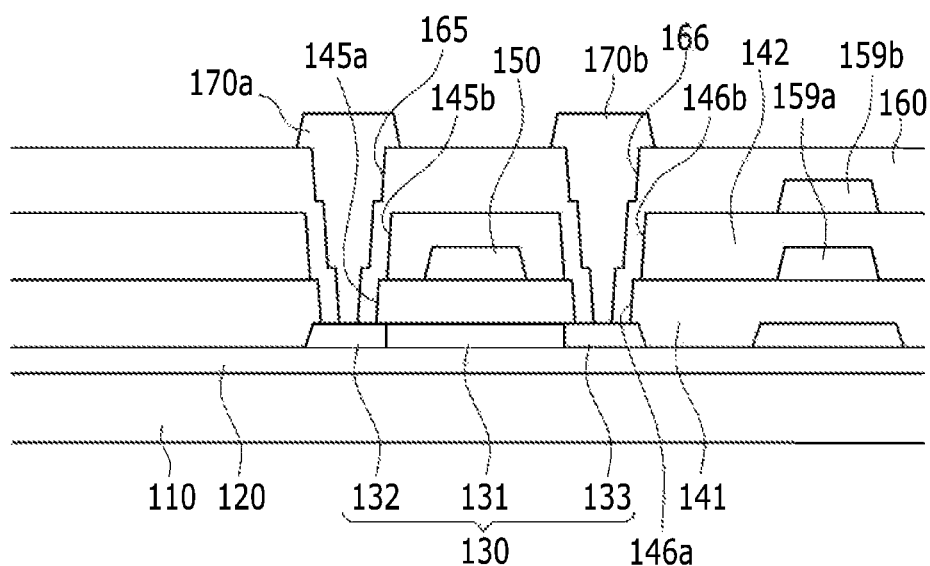
FIG. 5 is a cross-sectional view showing an OLED display according to an exemplary embodiment.

The OLED display according to an exemplary embodiment shown in FIG. 5 is almost the same as the OLED display according to an exemplary embodiment shown in FIG. 4 such that the description thereof is omitted. In the present exemplary embodiment, the size of the opening of the first gate insulating layer and the second gate insulating layer is different from the previous exemplary embodiment, and this will be described in detail.

FIG. 5 is a cross-sectional view showing an OLED display according to an exemplary embodiment. FIG. 5 shows one thin film transistor of the OLED display according to an exemplary embodiment, and the thin film transistor shown in FIG. 5 can be the driving thin film transistor, the switching thin film transistor, and the like. For convenience, the pixel electrode, the organic emission layer, the common electrode, and the like are omitted.

As shown in FIG. 5, the OLED display according to an exemplary embodiment includes the substrate 110, the semiconductor 130 positioned on the substrate 110, the first gate insulating layer 141 positioned on the semiconductor 130, the gate electrode 150 positioned on the first gate insulating layer 141, the second gate insulating layer 142 positioned on the gate electrode 150, the interlayer insulating layer 160 positioned on the second gate insulating layer 142, and the source electrode 170a and the drain electrode 170b positioned on the interlayer insulating layer 160.

The first gate insulating layer 141 has first openings 145a and 146a exposing at least part of the upper surface of the semiconductor 130. The first openings 145a and 146a expose the contact doping regions 132 and 133 of the semiconductor.

The second gate insulating layer 142 has second openings 145b and 146b exposing at least part of the upper surface of the semiconductor 130. The second openings 145b and 146b expose the contact doping regions 132 and 133 of the semiconductor.

The size of the second openings 145b and 146b is larger than the size of the first openings 145a and 146a. Accordingly, a stepped level difference is formed between the first gate insulating layer 141 and the second gate insulating layer 142.

The interlayer insulating layer 160 is formed of the organic insulating material. The interlayer insulating layer 160 is positioned on the second gate insulating layer 142 and is also positioned within the first openings 145a and 146a of the first gate insulating layer 141 and within the second openings 145b and 146b of the second gate insulating layer 142. That is, the side surface of the first gate insulating layer 141 and the interlayer insulating layer 160 are contacted within the first openings 145a and 146a. Also, the side surface of the second gate insulating layer 142 and the interlayer insulating layer 160 are contacted within the second openings 145b and 146b. In the present exemplary embodiment, since the step is formed between the first gate insulating layer 141 and the second gate insulating layer 142, the interlayer insulating layer 160 is directly contacted with the upper surface of the first gate insulating layer 141 on the periphery of the first openings 145a and 146a. That is, the interlayer insulating layer 160 is directly contacted with the upper surface of the first gate insulating layer 141 within the second openings 145b and 146b. Also, the side surface of the second gate insulating layer 142 is contacted with the interlayer insulating layer 160 within the second openings 145b and 146b.

The interlayer insulating layer 160 has the contact holes 165 and 166 exposing at least part of the upper surface of the semiconductor 130. The contact holes 165 and 166 expose the contact doping regions 132 and 133 of the semiconductor 130.

The contact holes 165 and 166 are positioned within the first openings 145a and 146a and the second openings 145b and 146b. The interlayer insulating layer 160 has the cross-sectional shape of the stepped level difference within the contact holes 165 and 166. On the part where the contact holes 165 and 166 are enclosed by the first openings 145a and 146a, the inner wall surface of the interlayer insulating layer 160 is positioned inside than the inner wall surface of the first gate insulating layer 141. On the part where the contact holes 165 and 166 are enclosed by the first openings 145a and 146a, the size of the first openings 145a and 146a is larger than the size of the contact holes 165 and 166. On the part where the contact holes 165 and 166 are enclosed by the second openings 145b and 146b, the inner wall surface of the interlayer insulating layer 160 is positioned inside than the inner wall surface of the second gate insulating layer 142. On the part where the contact holes 165 and 166 are enclosed by the second openings 145b and 146b, the size of the second openings 145b and 146b is larger than the size of the contact holes 165 and 166.

In the case of the present exemplary embodiment, compared with the exemplary embodiment shown in FIG. 3, as the gate insulating layer is made of two layers, the thickness of the interlayer insulating layer 160 is thick. Accordingly, in the process of forming the contact holes 165 and 166 in the interlayer insulating layer 160, the patterning depth of the interlayer insulating layer 160 can be relatively deep, and in some embodiments, it is not easy to form the taper angle of the interlayer insulating layer 160. In the present exemplary embodiment, the interlayer insulating layer 160 has the cross-sectional shape of the stepped level difference within the contact holes 165 and 166, the interlayer insulating layer 160 can have the similar shape to the tapered cross-sectional shape. The stepped level difference can be formed by using a half-tone mask or a slit mask in the process patterning the interlayer insulating layer 160.

The source electrode 170a and the drain electrode 170b are connected to the semiconductor 130 through the contact holes 165 and 166. The source electrode 170a and the drain electrode 170b are contacted with the interlayer insulating layer 160 on the inner wall of the contact holes 165 and 166 and are not contacted with the first gate insulating layer 141 and the second gate insulating layer 142. Accordingly, by filling the inside of the openings 145 and 146 of the first gate insulating layer 141 and the second gate insulating layer 142 with the interlayer insulating layer 160 formed of the organic insulating material, the buffering force increases such that the damage due to the bending or the folding can be prevented.

Next, the OLED display according to an exemplary embodiment will be described with reference to FIG. 6.

Figure 6:
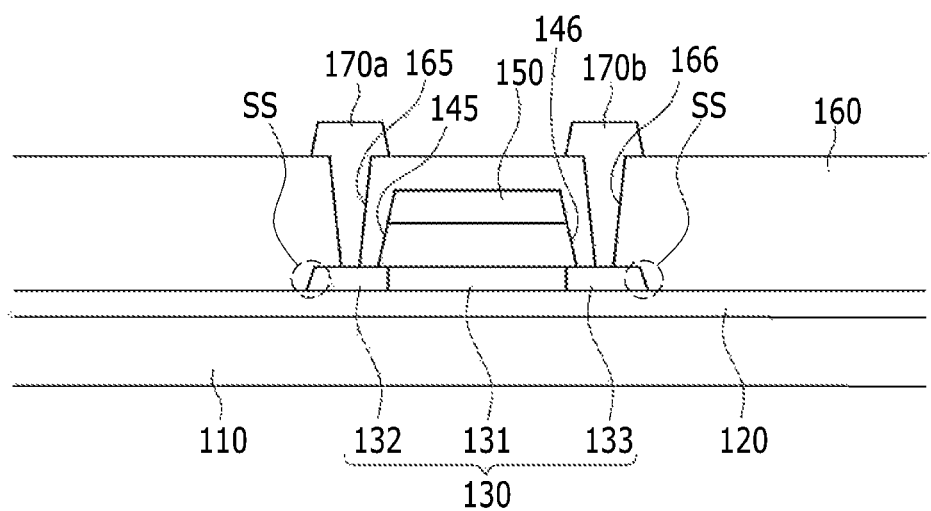
FIG. 6 is a cross-sectional view showing an OLED display according to an exemplary embodiment.

The OLED display according to an exemplary embodiment shown in FIG. 6 is almost the same as the OLED display according to an exemplary embodiment shown in FIG. 3 such that the description thereof is omitted. In the present exemplary embodiment, the gate insulating layer has substantially the same pattern as the gate electrode, differently from the previous exemplary embodiment.

FIG. 6 is a cross-sectional view showing an OLED display according to an exemplary embodiment. FIG. 6 shows one thin film transistor of the OLED display according to an exemplary embodiment, and the thin film transistor shown in FIG. 6 can be the driving thin film transistor, the switching thin film transistor, and the like. For convenience, the pixel electrode, the organic emission layer, the common electrode, and the like are omitted.

As shown in FIG. 6, the OLED display according to an exemplary embodiment includes the substrate 110, semiconductor 130 positioned on the substrate 110, the gate insulating layer 140 positioned on the semiconductor 130, the gate electrode 150 positioned on the gate insulating layer 140, the interlayer insulating layer 160 positioned on the gate electrode 150, and the source electrode 170a and the drain electrode 170b positioned on the interlayer insulating layer 160.

The gate insulating layer 140 has the openings 145 and 146 exposing at least part of the upper surface of the semiconductor 130 and the entire side surface SS of the semiconductor 130. The openings 145 and 146 expose the contact doping regions 132 and 133 of the semiconductor. In the previous exemplary embodiment, the openings 145 and 146 expose at least part of the upper surface of the semiconductor 130, does not expose the side surface SS of the semiconductor 130, and the gate insulating layer 140 covers the side surface SS of the semiconductor 130. In the exemplary embodiment, however, the openings 145 and 146 are formed to expose the side surface SS of the semiconductor, and the gate insulating layer 140 does not cover the side surface SS of the semiconductor 130. Also, the openings 145 and 146 is formed even to expose the upper surface of the buffer layer 120. Accordingly, in the present exemplary embodiment, the buffer layer 120 is not contacted with the gate insulating layer 140, and is contacted with the interlayer insulating layer 160.

The gate electrode 150 is positioned on the gate insulating layer 140. The openings 145 and 146 can be formed by patterning the gate insulating layer 140 by using the gate electrode 150 as a mask. Accordingly, the gate insulating layer 140 has substantially the same pattern as the gate electrode 150.

The interlayer insulating layer 160 is positioned on the gate electrode 150, and is also positioned within the openings 145 and 146 of the gate insulating layer 140. The interlayer insulating layer 160 is contacted with the side surface of the gate insulating layer 140 within the openings 145 and 146 and is not contacted with the upper surface of the gate insulating layer 140. The interlayer insulating layer 160 is also formed directly on the buffer layer 120.

The interlayer insulating layer 160 has the contact holes 165 and 166 exposing at least part of the upper surface of the semiconductor 130. The contact holes 165 and 166 are positioned within the openings 145 and 146, and the size of the openings 145 and 146 is larger than the size of the contact holes 165 and 166.

The source electrode 170a and the drain electrode 170b are connected to the semiconductor 130 through the contact holes 165 and 166, and the source electrode 170a and the drain electrode 170b are contacted with the interlayer insulating layer 160 on the inner wall of the contact holes 165 and 166. Accordingly, as the inside of the openings 145 and 146 of the gate insulating layer 140 is filled with the interlayer insulating layer 160 formed of the organic insulating material, the buffering force increases such that the damage due to the bending or the folding can be prevented.

Next, the OLED display according to an exemplary embodiment will be described with reference to FIG. 7.

Figure 7:
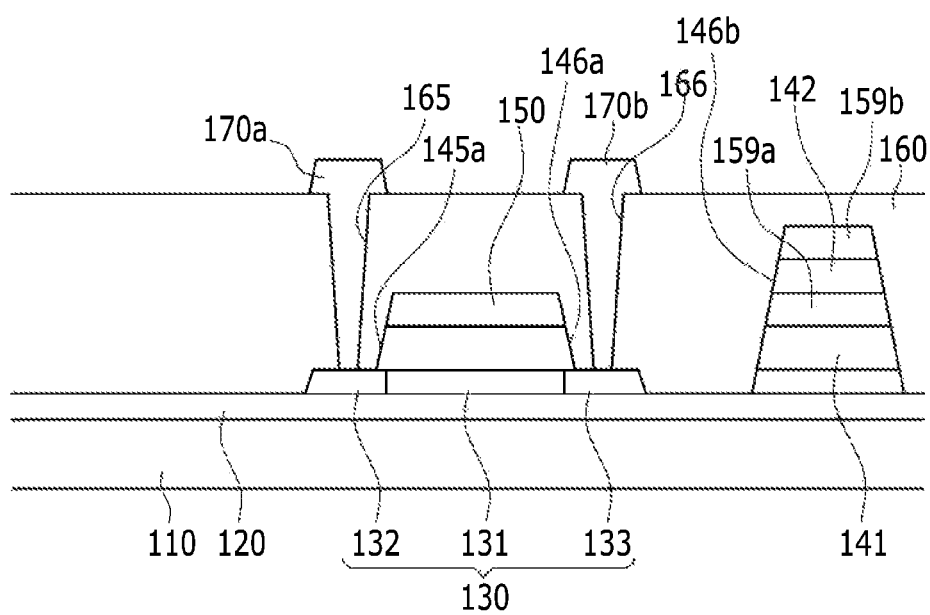
FIG. 7 is a cross-sectional view showing an OLED display according to an exemplary embodiment.

The OLED display according to an exemplary embodiment shown in FIG. 7 is almost the same as the OLED display according to an exemplary embodiment shown in FIG. 6 such that the description thereof is omitted. In the present exemplary embodiment, the gate insulating layer is made of two layers, differently from the previous exemplary embodiment, and it will be described in detail.

FIG. 7 is a cross-sectional view showing an OLED display according to an exemplary embodiment. FIG. 7 shows one thin film transistor of the OLED display according to an exemplary embodiment, and the thin film transistor shown in FIG. 7 can be the driving thin film transistor, the switching thin film transistor, and the like. For convenience, the pixel electrode, the organic emission layer, the common electrode, and the like are omitted.

As shown in FIG. 7, the OLED display according to an exemplary embodiment includes the substrate 110, the semiconductor 130 positioned on the substrate 110, the first gate insulating layer 141 positioned on the semiconductor 130, the gate electrode 150 positioned on the first gate insulating layer 141, the interlayer insulating layer 160 positioned on the gate electrode 150, and the source electrode 170a and the drain electrode 170b positioned on the interlayer insulating layer 160.

Also, the OLED display according to an exemplary embodiment can further includes a first capacitor electrode 159a positioned on the first gate insulating layer 141, a second gate insulating layer 142 positioned on the first capacitor electrode 159a, and a second capacitor electrode 159b positioned on the second gate insulating layer 142.

The first gate insulating layer 141 has the first openings 145a and 146a exposing at least part of the upper surface of the semiconductor 130. The first openings 145a and 146a expose the contact doping regions 132 and 133 of the semiconductor.

The gate electrode 150 and the first capacitor electrode 159a are positioned on the first gate insulating layer 141. The second gate insulating layer 142 is positioned between the first capacitor electrode 159a and the second capacitor electrode 159b, and is not formed on the gate electrode 150. The gate electrode 150 is positioned between the first gate insulating layer 141 and the interlayer insulating layer 160.

The second gate insulating layer 142 has the second opening 146b exposing at least part of the upper surface of the semiconductor 130. The second opening 146b has a similar pattern to the first openings 145a and 146a. However, the second opening 146b exposes the upper surface of the gate electrode 150, differently from the first openings 145a and 146a. Also, the first openings 145a and 146a and the second opening 146b expose the part of the buffer layer 120.

By patterning the first gate insulating layer 141 and the second gate insulating layer 142 by using the gate electrode 150 and the second capacitor electrode 159b as a mask, the first openings 145a and 146a and the second opening 146b can be formed. Accordingly, the first gate insulating layer 141 has substantially the same pattern as the gate electrode 150 and the second capacitor electrode 159b. The first capacitor electrode 159a and the second capacitor electrode 159*b* have substantially the same pattern such that the first gate insulating layer 141 has substantially the same pattern as the gate electrode 150 and the first capacitor electrode 159*a*. Also, the second gate insulating layer 142 has substantially the same pattern as the second capacitor electrode 159*b*.

The interlayer insulating layer 160 is positioned on the gate electrode 150 and the second capacitor electrode 159*b*, and is also positioned within the first openings 145*a* and 146*a* of the first gate insulating layer 141 and the second opening 146*b* of the second gate insulating layer 142. The interlayer insulating layer 160 is contacted with the side surface of the first gate insulating layer 141 within the first openings 145*a* and 146*a*, and is not contacted with the upper surface of the first gate insulating layer 141. The interlayer insulating layer 160 is contacted with the side surface of the second gate insulating layer 142 within the second opening 146*b* and is not contacted with the upper surface of the second gate insulating layer 142. The interlayer insulating layer 160 is formed directly on the buffer layer 120.

The interlayer insulating layer 160 has the contact holes 165 and 166 exposing at least part of the upper surface of the semiconductor 130. The contact holes 165 and 166 are positioned within the first openings 145*a* and 146*a*, and the size of the first openings 145*a* and 146*a* is larger than the size of the contact holes 165 and 166.

The source electrode 170*a* and the drain electrode 170*b* are connected to the semiconductor 130 through the contact holes 165 and 166, and the source electrode 170*a* and the drain electrode 170*b* are contacted with the interlayer insulating layer 160 on the inner wall of the contact holes 165 and 166. Accordingly, since the interlayer insulating layer 160 formed of the organic insulating material fills the first openings 145*a* and 146*a* of the first gate insulating layer 141 and the second opening 146*b* of the second gate insulating layer 142, the buffering force increases, thereby preventing the damage due to the bending or the folding.

Next, the OLED display according to an exemplary embodiment will be described with reference to FIG. 8.

Figure 8:
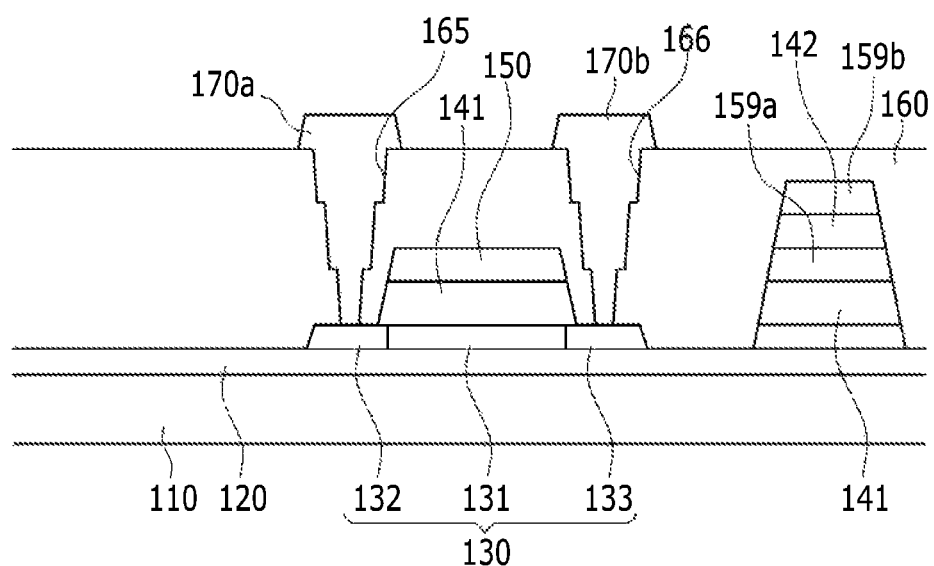
FIG. 8 is a cross-sectional view showing an OLED display according to an exemplary embodiment.

The OLED display according to an exemplary embodiment shown in FIG. 8 is almost the same as the OLED display according to an exemplary embodiment shown in FIG. 7 such that the description thereof is omitted. In the present exemplary embodiment, the interlayer insulating layer has the stepped level difference, differently from the previous exemplary embodiment, and it will be described in detail.

FIG. 8 is a cross-sectional view showing an OLED display according to an exemplary embodiment. FIG. 8 shows one thin film transistor of the OLED display according to an exemplary embodiment, and the thin film transistor shown in FIG. 8 can be the driving thin film transistor, the switching thin film transistor, and the like. For convenience, the pixel electrode, the organic emission layer, the common electrode, and the like are omitted.

As shown in FIG. 8, the OLED display according to an exemplary embodiment includes the substrate 110, the semiconductor 130 positioned on the substrate 110, the first gate insulating layer 141 positioned on the semiconductor 130, the gate electrode 150 positioned on the first gate insulating layer 141, the interlayer insulating layer 160 positioned on the gate electrode 150, and the source electrode 170*a* and the drain electrode 170*b* positioned on the interlayer insulating layer 160.

As the gate insulating layer is made of two layers, the interlayer insulating layer 160 is thick. To stably form the contact holes 165 and 166 in the interlayer insulating layer 160, the interlayer insulating layer 160 can have the cross-sectional shape of the stepped level difference within the contact holes 165 and 166. The stepped level difference can be formed by using the half-tone mask or the slit mask in the process patterning the interlayer insulating layer 160.

Next, an exemplary embodiment of the OLED display including the thin film transistor of the above-described various structures will be described.

First, the OLED display according to an exemplary embodiment will be described with reference to FIG. 9 and FIG. 11. Each thin film transistor of FIG. 9 to FIG. 11 has the structure of the thin film transistor of FIG. 3, however the described technology is not limited thereto, and the structure of other thin film transistors can be included. For example, the structure of the thin film transistor of FIG. 6 can be replaced.

Figure 9:
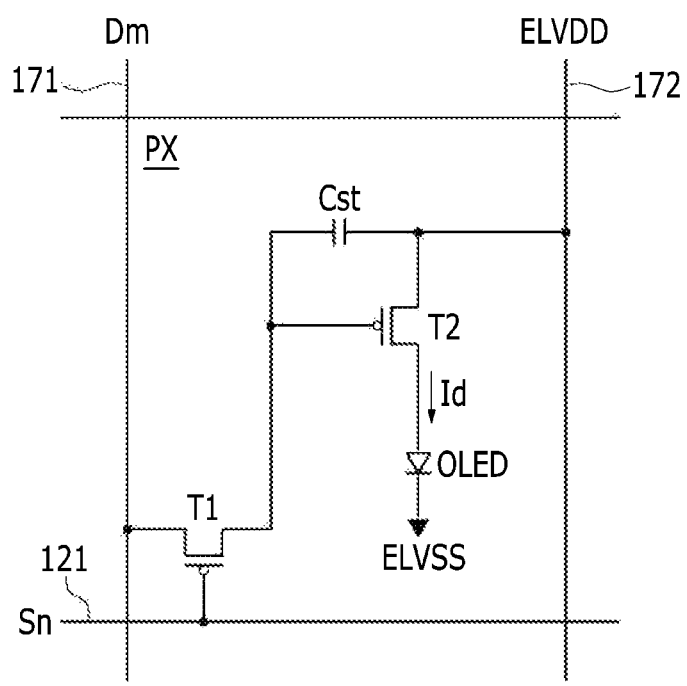
FIG. 9 is an equivalent circuit diagram of one pixel of an OLED display according to an exemplary embodiment.

FIG. 9 is an equivalent circuit diagram of one pixel of an OLED display according to an exemplary embodiment.

As shown in FIG. 9, one pixel PX of the OLED display according to an exemplary embodiment includes a plurality of signal lines 121, 171, and 172, a plurality of transistors T1 and T2 connected to the plurality of signal lines, a storage capacitor Cst, and an OLED.

The transistors T1 and T2 include a switching transistor T1 and a driving transistor T2.

The signal lines 121, 171, and 172 includes a plurality of scan lines 121 transmitting a scan signal Sn, a plurality of data lines 171 crossing the scan lines 121 and transmitting a data signal Dm, and a plurality of driving voltage lines 172 transmitting a driving voltage ELVDD and almost parallel to the data lines 171.

The switching transistor T1 has a control terminal, an input terminal, and an output terminal. The control terminal of the switching transistor T1 is connected to the scan line 121, the input terminal is connected to the data line 171, and the output terminal is connected to the driving transistor T2. The switching transistor T1 transmits a data signal applied to the data signal 171 to the driving transistor T2 in response to a scan signal applied to the scan line 121.

The driving thin film transistor T2 also includes a control terminal, an input terminal, and an output terminal. The control terminal of the driving transistor T2 is connected to the switching transistor T1, the input terminal is connected to the driving voltage line 172, and the output terminal is connected to the OLED. The driving transistor T2 flows an output current Id of which a magnitude varies according to a voltage applied between the control terminal and the output terminal.

The storage capacitor Cst is connected between the control terminal and the input terminal of the driving transistor T2. The storage capacitor Cst charges a data signal applied to the control terminal of the driving transistor T2, and maintains charging of the data signal after the switching transistor T1 is turned off.

The OLED includes an anode connected to the output terminal of the driving thin film transistor T2, a cathode connected to a common voltage ELVSS, and an organic light emitting member formed between the anode and the cathode. The OLED displays an image by emitting light with different intensities according to the output current Id of the driving transistor T2.

The switching transistor T1 and the driving transistor T2 can be n-channel field effect transistors (FETs) or p-channel FETs. In addition, a connection relationship between the thin film transistors T1 and T2, the storage capacitor Cst, and the OLED can be changed.

Now, a detailed structure of the pixel of the OLED display according to the exemplary embodiment shown in FIG. 9 will be described in further detail with reference to FIG. 10 and FIG. 11 as well as FIG. 9.

Figure 10:
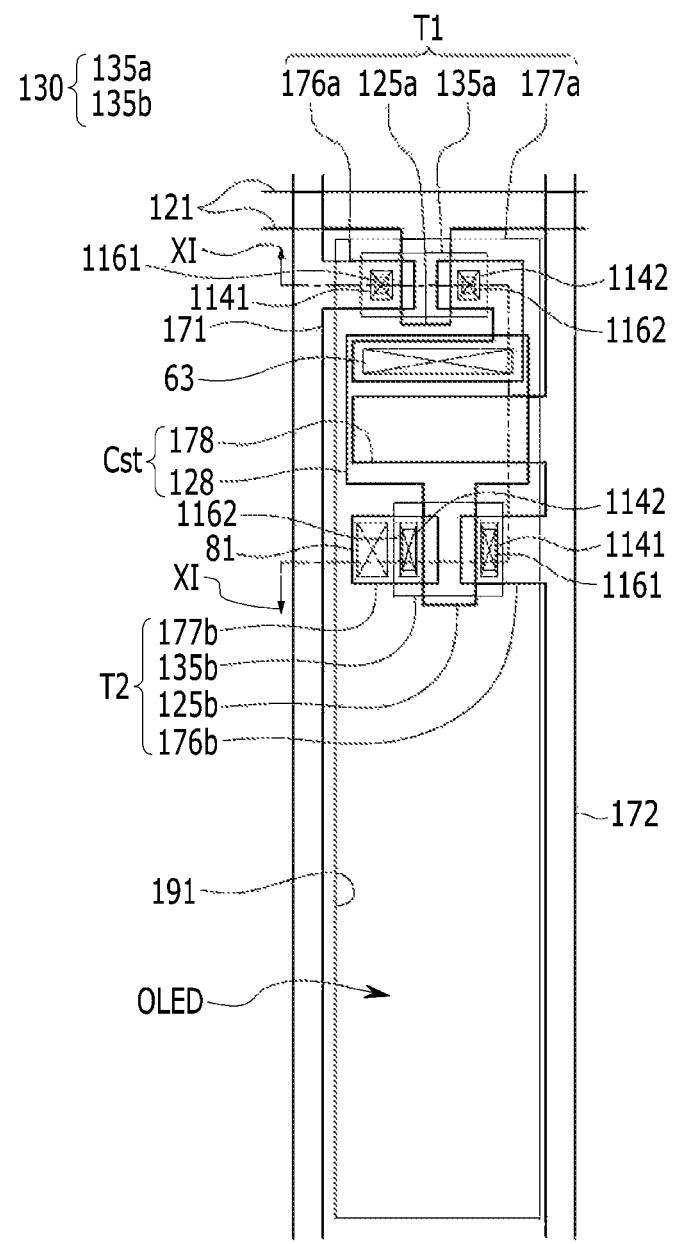
FIG. 10 is a layout view of one pixel of an OLED display according to an exemplary embodiment.
Figure 11:
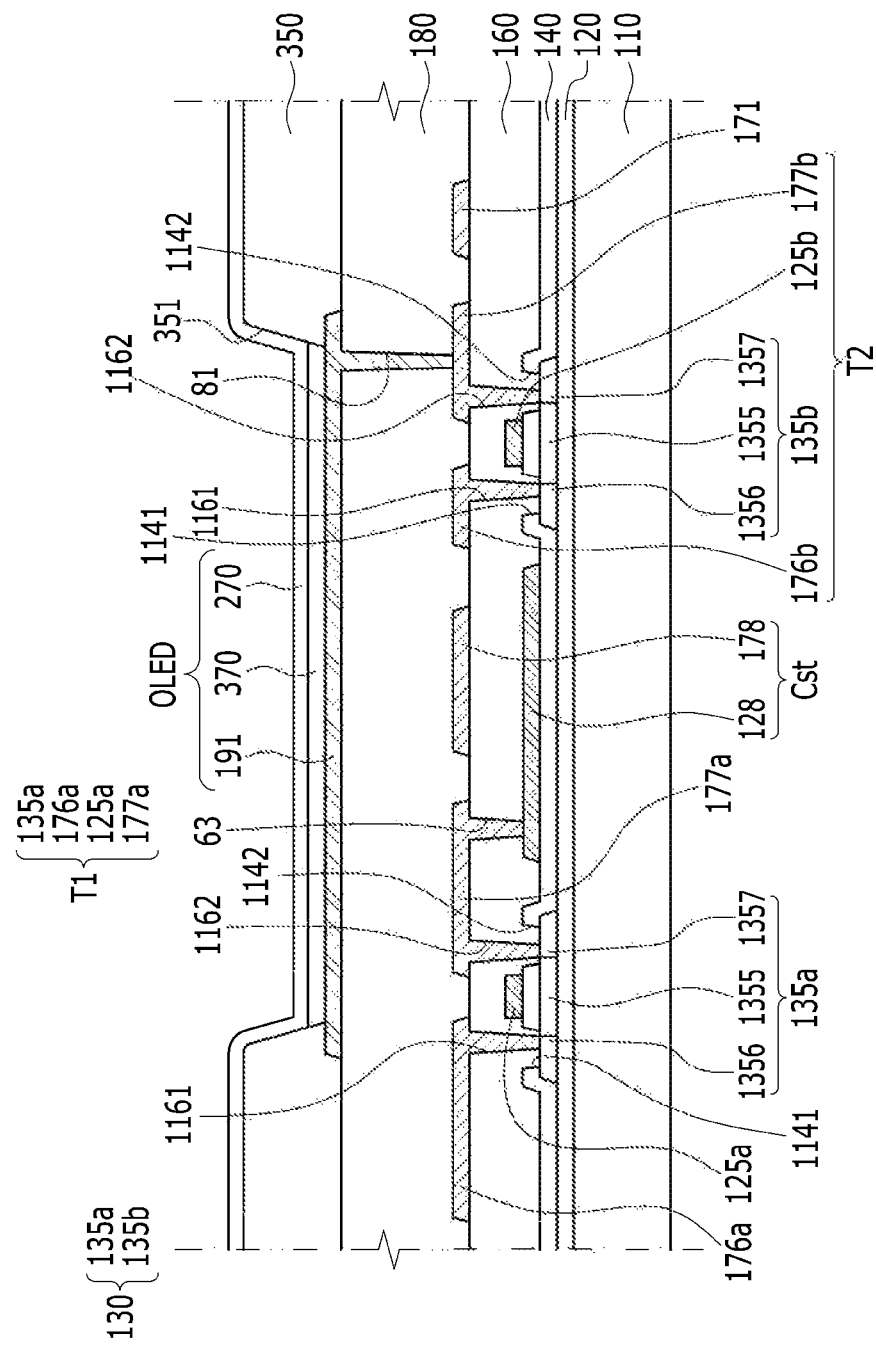
FIG. 11 is a cross-sectional view taken along a line XI-XI of FIG. 10.

FIG. 10 is a layout view of one pixel of an OLED display according to an exemplary embodiment, and FIG. 11 is a cross-sectional view taken along a line XI-XI of FIG. 10.

As shown in FIG. 10 and FIG. 11, in the OLED display according to an exemplary embodiment, a buffer layer 120 is formed on a substrate 110. The insulating substrate 110 can be formed of an insulating material such as glass, crystal, ceramic, or plastic, and the buffer layer 120 can be formed of a single layer of a silicon nitride (SiNx) or a dual-layer structure in which a silicon nitride (SiNx) and a silicon oxide (SiOx) are deposited. The buffer layer 120 serves to planarize a surface while preventing unnecessary materials such as impurities or moisture from permeating.

A semiconductor 130 is formed on the buffer layer 120. The semiconductor 130 includes a switching semiconductor 135a and a driving semiconductor 135b that are separated from each other. The semiconductors 135a and 135b can be formed of a polycrystalline semiconductor material or an oxide semiconductor material. The oxide semiconductor material can include any one oxide based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which are compound oxides thereof. In the case when the semiconductor layer 130 is formed of the oxide semiconductor, in order to protect the oxide semiconductor that is vulnerable to an external environment such as a high temperature, a separate passivation layer can be added.

The switching semiconductor 135a and the driving semiconductor 135b are respectively divided into a channel 1355 and a source region 1356 and drain region 1357 formed at respective sides of the channel 1355. The channel 1355 of the switching semiconductor 135a and the driving semiconductor 135b is channel-doped with a doping impurity of an N-type impurity or a P-type impurity, and the source region 1356 and the drain region 1357 of the switching semiconductor 135a and the driving semiconductor 135b are contact doping regions 1356 and 1457 that are contact-doped with a higher doping concentration of the doping impurity than with the channel doping.

A gate insulating layer 140 is formed on the switching semiconductor 135a and the driving semiconductor 135b. The gate insulating layer 140 is formed of the inorganic insulating material such as a silicon nitride (SiNx) or a silicon oxide (SiOx). The gate insulating layer 140 has openings 1141 and 1142 exposing at least part of the upper surface of the semiconductor 130. The openings 1141 and 1142 expose the contact doping regions 1356 and 1357 of the semiconductor 130.

A scan line 121, a driving gate electrode 125b, and a first storage capacitor plate 128 are formed on the gate insulating layer 140. The scan line 121 extends in the horizontal direction and transmits the scan signal Sn, and includes a switching gate electrode 125a protruded from the scan line 121 to the switching semiconductor 135a. The driving gate electrode 125b is protruded from the first storage capacitor plate 128 to the driving semiconductor 135b. The switching gate electrode 125a and the driving gate electrode 125b respectively overlap the channel 1355.

An interlayer insulating layer 160 is formed on the scan line 121, the driving gate electrode 125b, and the first storage capacitor plate 128. The interlayer insulating layer 160 is formed of the organic insulating material. The interlayer insulating layer 160 is also positioned within the openings 1141 and 1142 of the gate insulating layer 140. That is, within the openings 1141 and 1142, the side surface of the gate insulating layer 140 and the interlayer insulating layer 160 are contacted. The scan line 121, the driving gate electrode 125b, and the first storage capacitor plate 128 are positioned between the gate insulating layer 140 and the interlayer insulating layer 160.

The interlayer insulating layer 160 has contact holes 1161 and 1162 exposing at least part of the upper surface of the semiconductor 130. The contact holes 1161 and 1162 expose the contact doping regions 1356 and 1357 of the semiconductor 130. The contact holes 1161 and 1162 are positioned within the openings 1141 and 1142, and the size of the openings 1141 and 1142 is larger than the size of the contact holes 1161 and 1162. Also, the interlayer insulating layer 160 includes the storage contact hole 63 exposing the part of the first storage capacitor plate 128.

A data line 171 having a switching source electrode 176a, a driving voltage line 172 including a driving source electrode 176b and a second storage capacitor plate 178, a switching drain electrode 177a connected to the first storage capacitor plate 128, and a driving drain electrode 177b are formed on the interlayer insulating layer 160.

The data line 171 transmits the data signal Dm and extends in a direction crossing the scan line 121. The driving voltage line 172 transmits the driving voltage ELVDD and is separated from and extends in the same direction as the data line 171.

The switching source electrode 176a is protruded from the data line 171 toward the switching semiconductor 135a, and the driving source electrode 176b is protruded from the driving voltage line 172 to the driving semiconductor 135b. The switching source electrode 176a and the driving source electrode 176b are respectively connected to the source region 1356 through a source contact hole 61. The switching source electrode 176a and the driving source electrode 176b are contacted with the interlayer insulating layer 160 on the inner wall of the contact hole 1161. The switching source electrode 176a and the driving source electrode 176b are not directly contacted with the gate insulating layer 140.

The switching drain electrode 177a faces the switching source electrode 176a, the driving drain electrode 177b faces the driving source electrode 176b, and the switching drain electrode 177a and the driving drain electrode 177b are respectively connected to the drain region 1357 through a drain contact hole 62. The switching drain electrode 177a and the driving drain electrode 177b are contacted with the interlayer insulating layer 160 on the inner wall of the contact hole 1162. The switching drain electrode 177a and the driving drain electrode 177b are not contacted directly with the gate insulating layer 140.

The switching source electrode 176a, the driving source electrode 176b, the switching drain electrode 177a, and the driving drain electrode 177b are not directly contacted with the gate insulating layer 140 formed of the inorganic material, but are contacted with the interlayer insulating layer 160 formed of the organic material, thereby increasing the buffering force. In the present exemplary embodiment, the inside of the openings 1141 and 1142 of the gate insulating layer 140 is filled with the interlayer insulating layer 160 formed of the organic insulating material to increase the buffering force, thereby preventing the damage due to the bending or the folding.

The switching drain electrode 177a extends and is electrically connected to the first storage capacitor plate 128 and the driving gate electrode 125b through the storage contact hole 63 formed in the interlayer insulating layer 160.

The second storage capacitor plate 178 is protruded from the driving voltage line 171 and overlaps the first storage capacitor plate 128. Accordingly, the first storage capacitor plate 128 and the second storage capacitor plate 178 form the storage capacitor Cst using the interlayer insulating layer 160 as a dielectric material.

The switching semiconductor 135a, the switching gate electrode 125a, the switching source electrode 176a, and the switching drain electrode 177a form the switching transistor T1, and the driving semiconductor 135b, the driving gate electrode 125a, the driving source electrode 176b, and the driving drain electrode 177b form the driving transistor T2.

The passivation layer 180 is formed on the switching source electrode 176a, the driving source electrode 176b, the switching drain electrode 177a, and the driving drain electrode 177b.

A pixel electrode 191 is formed on the passivation layer 180, and the pixel electrode 191 can be formed of a transparent conductive material such as indium tin oxide (ITO), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 710 is electrically connected with the driving drain electrode 177b of the driving transistor T2 through a contact hole 81 formed in the interlayer insulating layer 160 to become an anode of an OLED.

A pixel defining layer 350 is positioned on the passivation layer 180 and an edge of the pixel electrode 191. The pixel defining layer 350 has a pixel opening 351 exposing the pixel electrode 191. The pixel definition layer 180 can include a resin such as a polyacrylate or polyimide, a silica-based inorganic material, and the like.

An organic emission layer 370 is formed in the pixel opening 351 of the pixel defining layer 350. The organic emission layer 370 is formed as a multilayer including one or more of an emission layer, a hole-injection layer (HIL), a hole-transporting layer (HTL), an electron-transporting layer (ETL), and an electron-injection layer (EIL. In the case where the organic emission layer 370 includes all the layers, the hole-injection layer is positioned on the pixel electrode 191 which is an anode, and the hole-transporting layer, the emission layer, the electron-transporting layer, and the electron-injection layer can be sequentially laminated thereon.

The organic emission layer 370 can include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby implementing a color image.

Further, the organic emission layer 370 can implement the color image by laminating the red organic emission layer, the green organic emission layer, and the blue organic emission layer together in the red pixel, the green pixel, and the blue pixel, and forming a red color filter, a green color filter, and a blue color filter for each pixel. As another example, white organic emission layers emitting white light are formed in all of the red pixel, the green pixel, and the blue pixel, and a red color filter, a green color filter, and a blue color filter are formed for each pixel, thereby implementing the color image. In the case of implementing the color image by using the white organic emission layer and the color filters, a deposition mask for depositing the red organic emission layer, the green organic emission layer, and the blue organic emission layer on respective pixels, that is, the red pixel, the green pixel, and the blue pixel, does not need to be used.

The white organic emission layer described in another example can be formed by one organic emission layer, and includes a configuration in which a plurality of organic emission layers are laminated to emit white light. For example, the white organic emission layer can include a configuration which can emit white light by combining at least one yellow organic emission layer and at least one blue organic emission layer, a configuration which can emit white light by combining at least one cyan organic emission layer and at least one red organic emission layer, a configuration which can emit white light by combining at least one magenta organic emission layer and at least one green organic emission layer, and the like.

A common electrode 270 is formed on the pixel defining layer 350 and the organic emission layer 370. The common electrode 720 can be formed of a transparent conductive material such as indium tin oxide (no), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 270 becomes the cathode of the OLED. The pixel electrode 191, the organic emission layer 370, and the common electrode 270 configure the OLED.

Next, the OLED display according to an exemplary embodiment will be described with reference to FIG. 12 to FIG. 16. Each thin film transistor of FIG. 12 to FIG. 16 has the structure of the thin film transistor of FIG. 4, however the described technology is not limited thereto, and other structures of the thin film transistor can be provided. For example, the structure of the thin film transistor of FIG. 5, FIG. 7, and FIG. 8 can be replaced.

Figure 12:
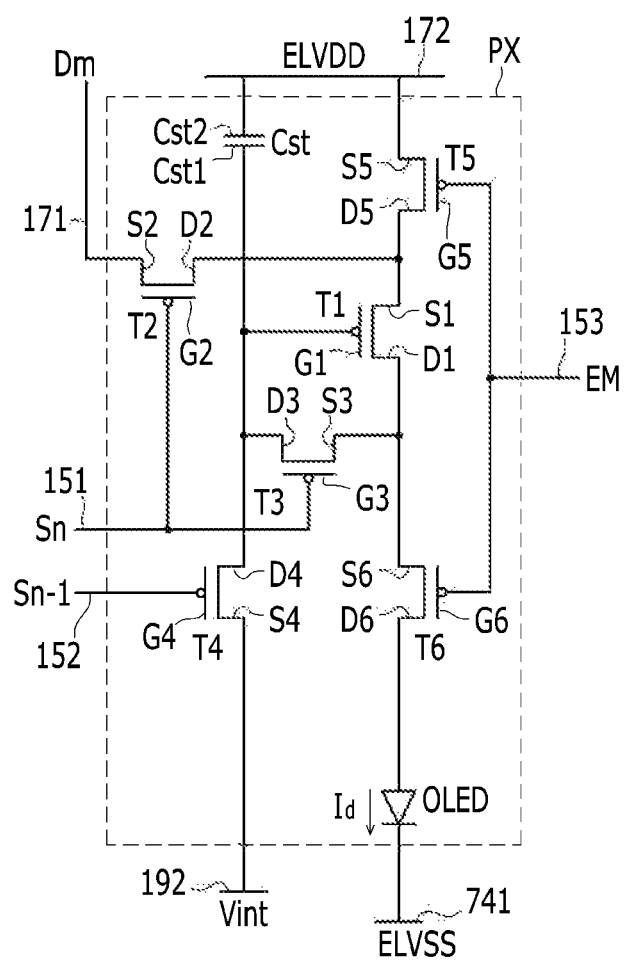
FIG. 12 is an equivalent circuit diagram of one pixel of an OLED display according to an exemplary embodiment.

FIG. 12 is an equivalent circuit diagram of one pixel of an OLED display according to an exemplary embodiment.

As shown in FIG. 6, the OLED display according to an exemplary embodiment includes a plurality of signal lines 151, 152, 153, 158, 171, 172, and 192 and a plurality of pixels PX connected to the signal lines and arranged in the substantial matrix type.

Each pixel PX includes a plurality of transistors T1, T2, T3, T4, T5, and T6 connected to the plurality of signal lines 151, 152, 153, 171, 172, and 192, a storage capacitor Cst, and an OLED.

The transistors T1, T2, T3, T4, T5, and T6 include a driving transistor T1, a switching transistor T2, a compensation transistor T3, an initialization transistor T4, an operation control transistor, T5 and a light emission control transistor T6. The signal lines 151, 152, 153, 171, 172, and 192 includes a scan line 151 transmitting a scan signal Sn, a previous scan line 152 transmitting a previous scan signal S(n−1) to the initialization transistor T4, a light emission control line 153 transmitting a light emission control signal EM to the operation control transistor T5 and the light emission control transistor T6, a data line 171 crossing the scan line 151 and transmitting a data signal Dm, a driving voltage line 172 transmitting a driving voltage ELVDD and formed to be almost parallel to the data line 171, and an initialization voltage line 192 transmitting an initialization voltage Vint initializing the driving transistor T1.

A gate electrode G1 of the driving transistor T1 is connected to one end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the OLED via the emission control transistor T6. The driving transistor T1 receives the data signal Dm according to a switching operation of the switching transistor T2 to supply a driving current 1d to the OLED.

A gate electrode G2 of the switching transistor T2 is connected with the scan line 151, a source electrode S2 of the switching transistor T2 is connected with the data line 171, and a drain electrode D2 of the switching transistor T2 is connected with the source electrode S1 of the driving transistor T1 and connected with the driving voltage line 172 via the operation control transistor T5. The switching transistor T2 is turned on according to the scan signal Sn received through the scan line 121 to perform a switching operation transferring the data signal Dm transferred to the data line 171 to the source electrode of the driving transistor T1.

A gate electrode G3 of the compensation transistor T3 is directly connected with the scan line 151, a source electrode S3 of the compensation transistor T3 is connected to the drain electrode D1 of the driving transistor T1 and with an anode of the OLED via the light emission control transistor T6, and a drain electrode D3 of the compensation transistor T3 is connected with one end Cst1 of the storage capacitor Cst and the drain electrode D4 of the initialization transistor T4, and the gate electrode G1 of the driving transistor T1, together. The compensation transistor T3 is turned on according to the scan signal Sn received through the scan line 151 to connect the gate electrode G1 and the drain electrode D1 of the driving transistor T1 and diode-connect the driving transistor T1.

A gate electrode G4 of the initialization transistor T4 is connected with the previous scan line 152, a source electrode S4 of the initialization transistor T4 is connected with the initialization voltage line 192, and a drain electrode D4 of the initialization transistor T4 is connected with one end Cst1 of the storage capacitor Cst and the gate electrode G1 of the driving transistor T1 together through the drain electrode D3 of the compensation transistor T3. The initialization transistor T4 is turned on according to a previous scan signal S(n−1) received through the previous scan line 152 to transfer the initialization voltage Vint to the gate electrode G1 of the driving transistor T1 and then perform an initialization operation of initializing a voltage of the gate electrode G1 of the driving transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the light emission control transistor T6 is connected to the light emission control line 153, the source electrode S6 of the light emission control transistor T6 is connected to the drain electrode D1 of the driving transistor T1 and the source electrode S3 of the compensation transistor T3, and the drain electrode D6 of the first light emission control transistor T6 is electrically connected to the anode of the OLED. The operation control transistor T5 and the light emission control transistor T6 are substantially simultaneously turned on according to the light emission control signal EM transmitted to the light emission control line 153 such that the driving voltage ELVDD is compensated through the diode-connected driving transistor T1 and is transmitted to the OLED.

The other end Cst2 of the storage capacitor Cst is connected with the driving voltage line 172, and a cathode of the OLED is connected with a common voltage line 741 transferring a common voltage ELVSS.

Next, the detailed structure of the OLED display according to an exemplary embodiment shown in FIG. 12 will be described with reference to FIG. 13, FIG. 14, FIG. 15, and FIG. 16 as well as FIG. 12.

Figure 13:
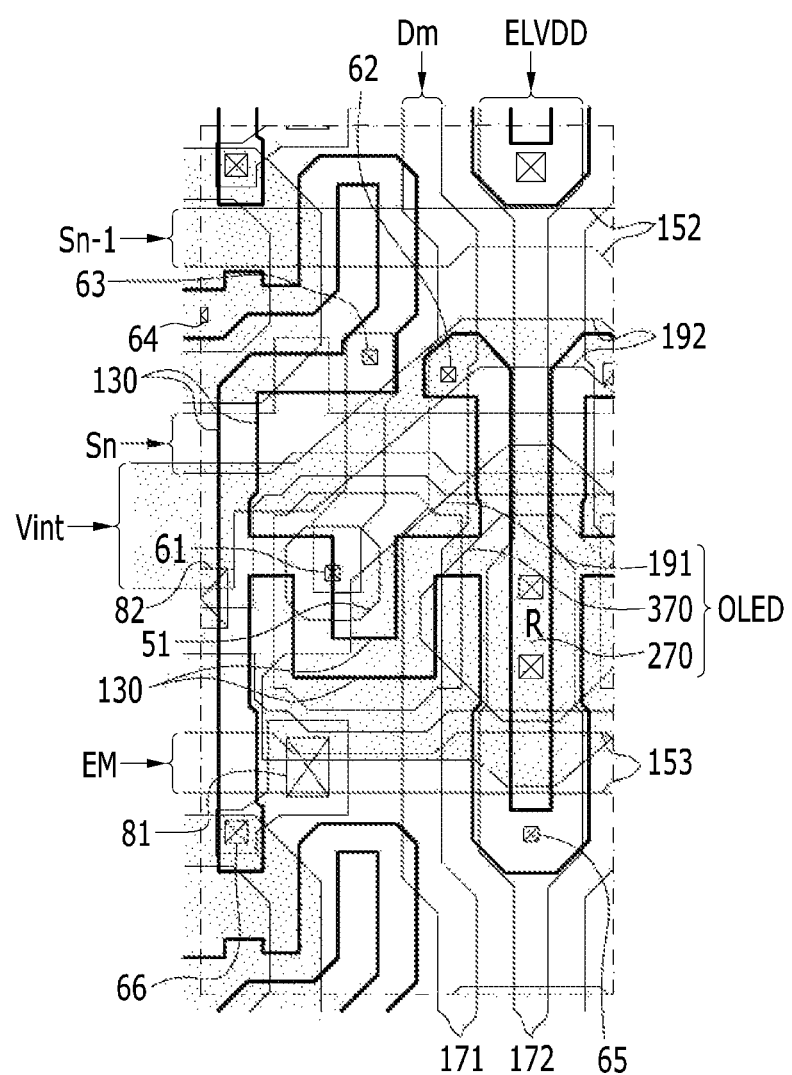
FIG. 13 is a schematic layout view of a plurality of transistors and a capacitor of an OLED display according to an exemplary embodiment.
Figure 14:
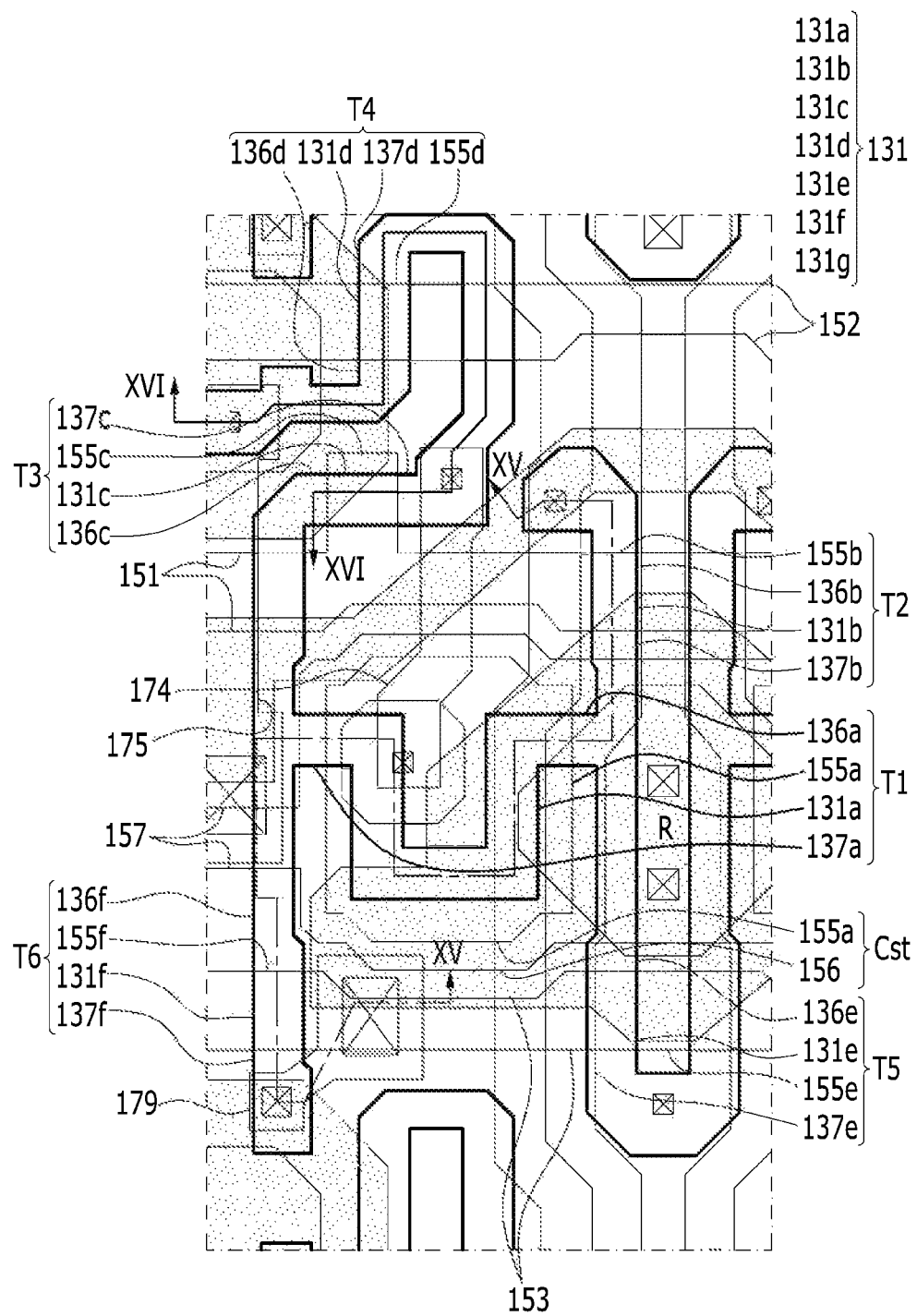
FIG. 14 is a detailed layout view of FIG. 13.
Figure 15:
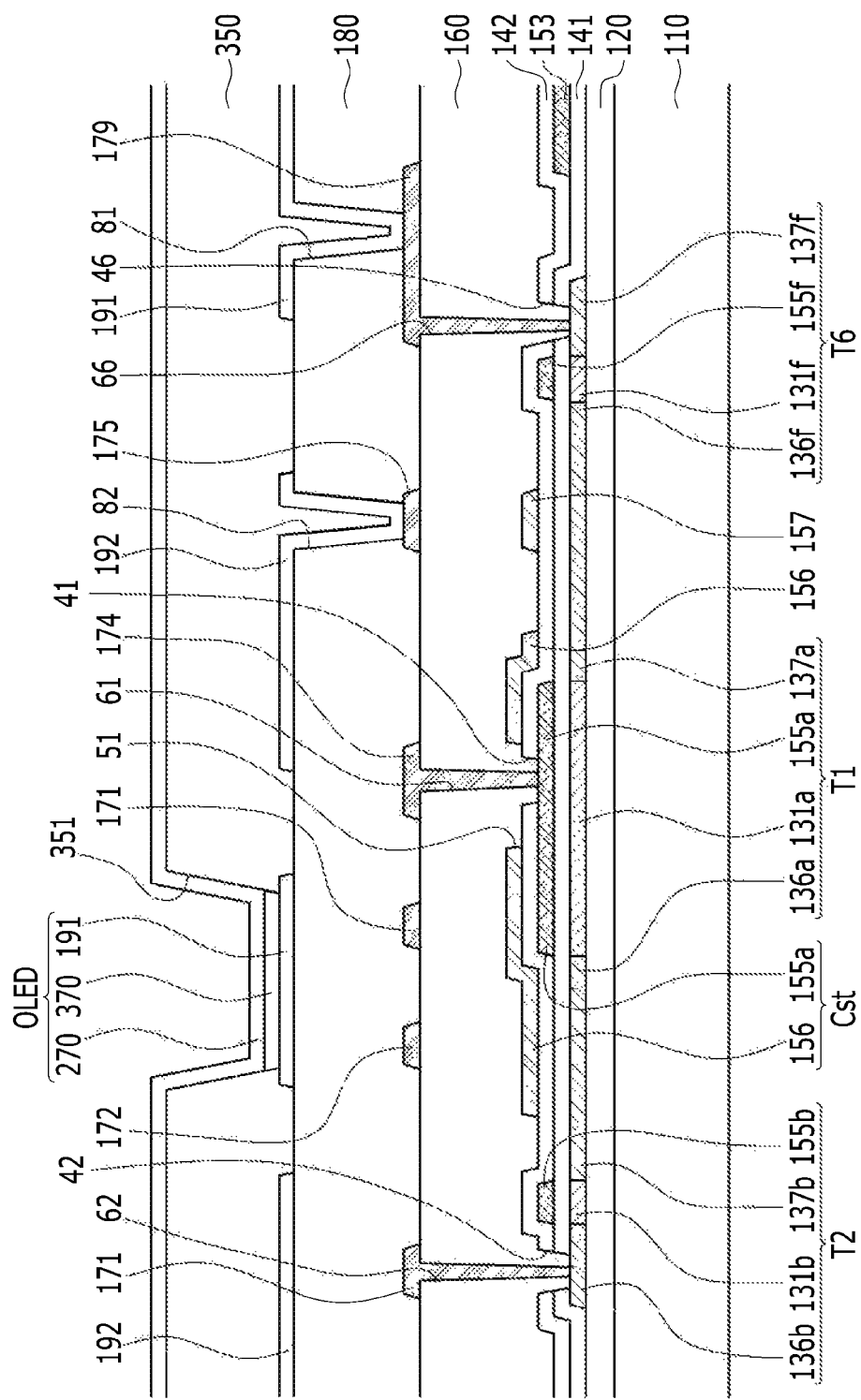
FIG. 15 is a cross-sectional view of the OLED display of FIG. 14 taken along a line XV-XV.
Figure 16:
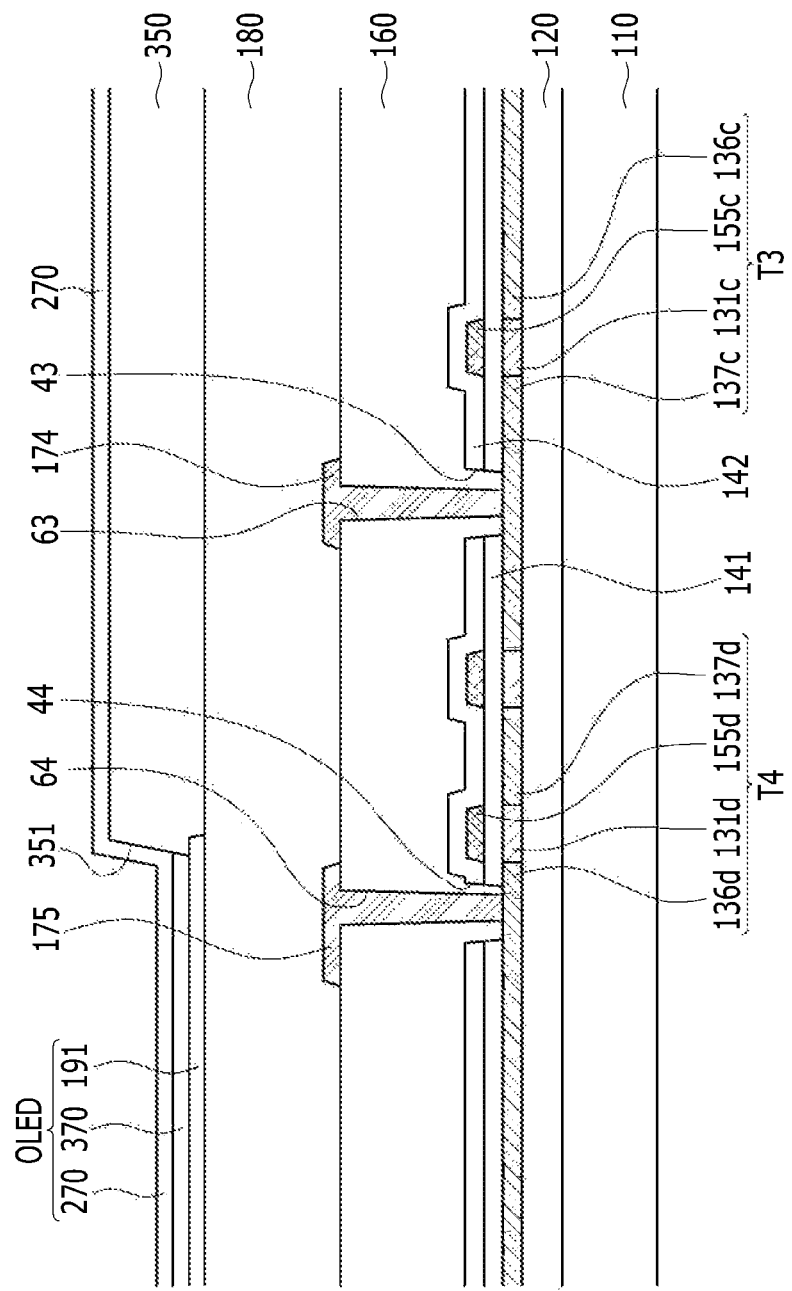
FIG. 16 is a cross-sectional view of the OLED display of FIG. 14 taken along a line XVI-XVI.

FIG. 13 is a schematic layout view of a plurality of transistors and a capacitor of an OLED display according to an exemplary embodiment. FIG. 14 is a detailed layout view of FIG. 13. FIG. 15 is a cross-sectional view of the OLED display of FIG. 14 taken along a line XV-XV. FIG. 16 is a cross-sectional view of the OLED display of FIG. 14 taken along a line XVI-XVI.

Hereinafter, a detailed planar structure of the OLED display device according to the exemplary embodiment will be first described in detail with reference to FIG. 13 and FIG. 14, and a detailed cross-sectional structure will be described in detail with reference to FIG. 15 and FIG. 16.

The OLED display according to an exemplary embodiment includes a scan line 151, a previous scan line 152, and a light emission control line 153 respectively applying the scan signal Sn, the previous scan signal S(n−1), and the light emission control signal EM and formed along with the row direction. Also, a data line 171 and a driving voltage line 172 crossing the scan line 151, the previous scan line 152, and the light emission control line 153 and respectively applying the data signal Dm and the driving voltage ELVDD to the pixel PX are included. The initialization voltage Vint is transmitted from the initialization voltage line 192 through the initialization transistor T4 to the compensation transistor T3. The initialization voltage line 192 is formed while alternately having a straight portion and an oblique portion.

Also, in each pixel PX, the driving transistor T1, the switching transistor T2, the compensation transistor T3, the initialization transistor T4, the operation control transistor T5, the light emission control transistor T6, the storage capacitor Cst, and the OLED are formed.

The OLED is made of the pixel electrode 191, the organic emission layer 370, and the common electrode 270. In this case, the initialization transistor T4 is configured as a dual gate structure transistor in order to block a leakage current.

Each channel of the driving transistor T1, the switching transistor T2, the compensation transistor T3, the initialization transistor T4, the operation control transistor T5, and the light emission control transistor T6 is formed inside one semiconductor 130, and the semiconductor 130 can be formed to be curved in various shapes. The semiconductor 130 can be formed of a polycrystalline semiconductor material or an oxide semiconductor material.

The semiconductor 130 includes a channel which is doped with an N-type impurity or a P-type impurity, and a source doping part and a drain doping part which are formed at respective sides of the channel and doped with an opposite-type doping impurity to the doping impurity doped on the channel. In the exemplary embodiment, the source doping part and the drain doping part correspond to the source electrode and the drain electrode, respectively. The source electrode and the drain electrode formed in the semiconductor 130 can be formed by doping only the corresponding regions. Further, in the semiconductor 130, a region between source electrodes and drain electrodes of different transistors is doped, and thus the source electrode and the drain electrode can be electrically connected to each other.

The channel 131 includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, and a light emission control channel 131f formed in the light emission control transistor T6.

The driving transistor T1 includes the driving channel 131a, a driving gate electrode 155a, a driving source electrode 136a, and a driving drain electrode 137a. The driving channel 131a is curved and can have a meandering shape or a zigzag shape. As such, by forming the curved driving channel 131a, the driving channel 131a can be formed to be elongated in a narrow space. Accordingly, a driving range of the driving gate-source voltage Vgs between the driving gate electrode 155a and the driving source electrode 136a is increased by the elongated driving channel 131a. The driving range of the driving gate-source voltage Vgs means a difference between the maximum driving gate-source voltage of the driving transistor corresponding to the maximum gray and the minimum driving gate-source voltage of the driving transistor corresponding to the minimum gray or the difference between the driving gate-source voltages Vgs for each step for the gray expression. Since the driving range of the gate voltage is increased, a gray scale of light emitted from the OLED can be finely controlled by changing the magnitude of the gate voltage, and as a result, the resolution of the OLED display device can be enhanced and display quality can be improved. Various examples such as 'reverse S', 'S', 'M', and 'W' can be implemented by variously modifying the shape of the driving channel 131a.

The driving gate electrode 155a overlaps with the driving channel 131a, and the driving source electrode 136a and the driving drain electrode 137a are formed at respective sides of the driving channel 131a to be close. The driving gate electrode 155a is connected to a first data connecting member 174 through a contact hole 61.

The switching transistor T2 includes the switching channel 131b, a switching gate electrode 155b, a switching source electrode 136b, and a switching drain electrode 137b. The switching gate electrode 155b which is some of the portion extending downward from the scan line 151 overlaps the switching channel 131b and the switching source electrode 136b and the switching drain electrode 137b are formed to be adjacent to respective sides of the switching channel 131b. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. The compensation gate electrode 155c as the part of the scan line 151 overlaps the compensation channel 131c. The compensation source electrode 136c and the compensation drain electrode 137c are formed to be adjacent to respective sides of the compensation channel 131c. The compensation drain electrode 137c is connected to a first data connecting member 174 through a contact hole 63.

The initialization transistor T4 includes the initialization channel 131d, an initialization gate electrode 155d, an initialization source electrode 136d, and an initialization drain electrode 137d. The initialization gate electrode 155d that is a part of the previous scan line 152 is formed as two to prevent the leakage current, and overlaps the initialization channel 131d. The initialization source electrode 136d and the initialization drain electrode 137d are formed to be adjacent to respective sides of the initialization channel 131d. The initialization source electrode 136d is connected to a second data connecting member 175 through a contact hole 64.

The operation control transistor T5 includes the operation control channel 131e, an operation control gate electrode 155e, an operation control source electrode 136e, and an operation control drain electrode 137e. The operation control gate electrode 155e that is a part of the light emission control line 153 overlaps the operation control channel 131e, and the operation control source electrode 136e and the operation control drain electrode 137e are formed to be adjacent to respective sides of the operation control channel 131e. The operation control source electrode 136e is connected to a part that extends from the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f that is a part of the light emission control line 153 overlaps the light emission control channel 131f, and the light emission control source electrode 136f and the light emission control drain electrode 137f are formed to be adjacent to respective sides of the light emission control channel 131f. The light emission control drain electrode 137f is connected to a third data connecting member 179 through a contact hole 66.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 156 disposed via a second gate insulating layer 142 interposed therebetween. The first storage electrode 155a corresponds to the driving gate electrode 155a, and the second storage electrode 156 is a portion extending from a storage line 157 and occupies a wider area than that of the driving gate electrode 155a and completely covers the driving gate electrode 155a.

Here, the second gate insulating layer 142 is a dielectric material, and storage capacitance is determined by a charge charged in the storage capacitor Cst and a voltage between both electrodes 155a and 156. As such, the driving gate electrode 155a is used as the first storage electrode 155a, and thus a space in which the storage capacitor can be formed can be secured in a space that is narrowed due to the driving channel 131a occupying a large area within the pixel.

The first storage electrode 155a which is the driving gate electrode 155a is connected to one end of the driving connecting member 174 through an opening 41, the contact hole 61, and a storage opening 51. The storage opening 51 is an opening which is formed in the second storage electrode 156. Accordingly, the contact hole 61 to connect one end of the driving connecting member 174 and the driving gate electrode 155a is formed inside the storage opening 156. The first driving connecting member 174 is formed with the same layer as the data line 171 to be almost parallel therewith, and the other end of the first driving connecting member 174 is connected to the compensation drain electrode 137c of the compensation transistor T3 and the initialization drain electrode 137d of the initialization transistor T4 through the contact hole 63. Accordingly, the first driving connecting member 174 connects the driving gate electrode 155a and the compensation drain electrode 137c of the compensation transistor T3 and the initialization drain electrode 137d of the initialization transistor T4 to each other.

Accordingly, the storage capacitor Cst stores storage capacitance corresponding to a difference between the driving voltage ELVDD transmitted to the second storage electrode 156 through the driving voltage line 172 and the gate voltage Vg of the driving gate electrode 155a.

The pixel connecting member 179 is connected to the pixel electrode 191 through a contact hole 81, and the initialization connecting member 175 is connected to the initialization voltage line 192 through a contact hole 82.

Hereinafter, the cross-sectional structures of the OLED display device according to an exemplary embodiment will be described in detail according to a stacking order.

A buffer layer 120 can be formed on an insulating substrate 110.

On the buffer layer 120, the semiconductor 130 including the channel 131 including the driving channel 131a, the switching channel 131b, the compensation channel 131c, the initialization channel 131d, the operation control channel 131e, and the light emission control channel 131f is formed. The driving source electrode 136a and the driving drain electrode 137a are formed on respective sides of the driving channel 131a in the semiconductor 130, and the switching source electrode 136b and the switching drain electrode 137b are formed on respective sides of the switching channel 131b. The compensation source electrode 136c and the compensation drain electrode 137c are formed at respective sides of the compensation channel 131c, and the initialization source electrode 136d and the initialization drain electrode 137d are formed at respective sides of the initialization channel 131d. The operation control source electrode 136e and the operation control drain electrode 137e are formed at respective sides of the operation control channel 131e, and the emission control source electrode 136f and the emission control drain electrode 137f are formed at respective sides of the emission control channel 131f.

A first gate insulating layer 141 covering the semiconductor 130 is formed thereon. On the first gate insulating layer 141, a first gate wire (151, 152, 153, 155a, 155b, 155c, 155d, 155e, and 155f) including a switching gate electrode 155b, a scan line 151 including a compensation gate electrode 155c, a previous scan line 152 including an initialization gate electrode 155d, a light emission control line 153 including an operation control gate electrode 155e and a light emission control gate electrode 155f, and a driving gate electrode (a first storage electrode) 155a is formed.

A second gate insulating layer 142 covering the first gate wire (151, 152, 153, 155a, 155b, 155c, 155d, 155e, and 155f) and the first gate insulating layer 141 is formed thereon. The first gate insulating layer 141 and the second gate insulating layer 142 are formed of the inorganic insulating material such as a silicon nitride (SiNx) and silicon oxide (SiOx). The first gate insulating layer 141 and the second gate insulating layer 142 have openings 41, 42, 43, 44, 45, and 46 exposing at least part of the upper surface of the semiconductor 130.

Second gate wires 157 and 156 including the storage line 157 parallel to the scan line 151 and the second storage electrode 156 as a portion extending from the storage line 157 are formed on the second gate insulating layer 142.

The second storage electrode 156 is wider than the first storage electrode 155a functioning as the driving gate electrode such that the second storage electrode 156 covers the entire driving gate electrode 155a.

An interlayer insulating layer 160 is formed on the second gate insulating layer 142 and the second gate wires 157 and 156. The interlayer insulating layer 160 is formed of the organic insulating material. The interlayer insulating layer 160 is also positioned within the openings 41, 42, 43, 44, 45, and 46 of the first gate insulating layer 141 and the second gate insulating layer 142. That is, within the openings 41, 42, 43, 44, 45, and 46, the side surface of the first gate insulating layer 141 and the second gate insulating layer 142, and the interlayer insulating layer 160 are contacted.

The interlayer insulating layer 160 has contact holes 61, 62, 63, 64, 65, and 66 exposing at least part of the upper surface of the semiconductor 130. The contact holes 61, 62, 63, 64, 65, and 66 are positioned within the openings 41, 42, 43, 44, 45, and 46, and the size of the openings 41, 42, 43, 44, 45, and 46 is larger than the size of the contact holes 61, 62, 63, 64, 65, and 66.

A data wire (171, 172, 174, 175, and 179) including the data line 171, the driving voltage line 172, the first data connecting member 174, the second data connecting member 175, and the third data connecting member 179 is formed on the interlayer insulating layer 160.

The data line 171 is connected to the switching source electrode 136b through the contact hole 62. The data line 171 is contacted with the interlayer insulating layer 160 on the inner wall of the contact hole 62, but is not directly contacted with the first gate insulating layer 141 and the second gate insulating layer 142.

One end of the first data connecting member 174 is connected to the first storage electrode 155a through the contact hole 61, and the other end of the first data connecting member 174 is connected to the compensation drain electrode 137c and the initialization drain electrode 137d through the contact hole 63. The first data connecting member 174 is contacted with the interlayer insulating layer 160 on the inner wall of the contact hole 61 and 63, but is not directly contacted with the first gate insulating layer 141 and the second gate insulating layer 142.

The second data connecting member 175 parallel to the data line 171 is connected to the initialization source electrode 136d through the contact hole 64. The second data connecting member 175 is contacted with the interlayer insulating layer 160 on the inner wall of the contact hole 64, but is not directly contacted with the first gate insulating layer 141 and the second gate insulating layer 142.

The third data connecting member 179 is connected to the light emission control drain electrode 137f through the contact hole 66. The third data connecting member 179 is contacted with the interlayer insulating layer 160 on the inner wall of the contact hole 66, but is not directly contacted with the first gate insulating layer 141 and second gate insulating layer 142.

The data line 171, the first data connecting member 174, the second data connecting member 175, and the third data connecting member 179 are not directly contacted with the first gate insulating layer 141 and the second gate insulating layer 142 formed of the inorganic material, but are contacted with the interlayer insulating layer 160 formed of the organic material, thereby increasing the buffering force. In the present exemplary embodiment, the inside of the openings 41, 42, 43, 44, 45, and 46 of the first gate insulating layer 141 and the second gate insulating layer 142 is filled with the interlayer insulating layer 160 formed of the organic insulating material such that the buffering force increases, thereby preventing the damage due to the bending or the folding.

A passivation layer 180 covering the data wire (171, 172, 174, 175, and 179), and the interlayer insulating layer 160 is formed thereon. The passivation layer 180 can be formed of an organic layer.

A pixel electrode 191 and an initialization voltage line 192 are formed on the passivation layer 180. The third data connection member 179 is connected with the pixel electrode 191 through a contact hole 81 formed on the passivation layer 180, and the second data connection member 175 is connected with the initialization voltage line 192 through a contact hole 82 formed on the passivation layer 180.

A pixel defined layer (PDL) 350 covering the passivation layer 180, the initialization voltage line 192, and the pixel electrode 191 is formed on edges of the passivation layer 180, the initialization voltage line 192, and the pixel electrode 191, and the pixel defined layer 350 has a pixel opening 351 that exposes the pixel electrode 191.

An organic emission layer 370 is formed on the pixel electrode 191 exposed by the pixel opening 351, and a common electrode 270 is formed on the organic emission layer 370. The common electrode 270 is formed on the pixel defined layer 350 to be formed through the plurality of pixels. As such, an OLED OLED is formed, which includes the pixel electrode 191, the organic emission layer 370, and the common electrode 270.

An encapsulation member (not shown) protecting the OLED can be formed on the common electrode 270, and the encapsulation member can be sealed to the substrate 110 by a sealant and can be formed of various materials such as glass, quartz, ceramic, plastic, and a metal. On the other hand, a thin film encapsulation layer can be formed on the common electrode 270 by depositing the inorganic layer and the organic layer without the usage of the sealant.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
    a substrate having a flexible portion configured to bend or fold;
    a semiconductor positioned over the substrate;
    a gate insulating layer positioned over the semiconductor and having an opening;
    an interlayer insulating layer positioned over the gate insulating layer, wherein a portion of the interlayer insulating layer is positioned within the opening;
    a gate electrode positioned between the gate insulating layer and the interlayer insulating layer and overlapping the semiconductor in the depth dimension of the OLED display; and
    a source electrode and a drain electrode positioned over the interlayer insulating layer and connected to the semiconductor.

2. The OLED display of claim 1, wherein the interlayer insulating layer comprises an organic insulating material.

3. The OLED display of claim 2, wherein the gate insulating layer comprises the organic insulating material or an inorganic insulating material.

4. The OLED display of claim 2, wherein the interlayer insulating layer has a contact hole positioned within the opening, and wherein the source and drain electrodes are connected to the semiconductor through the contact hole.

5. The OLED display of claim 4, wherein the contact hole has a tapered shape.

6. The OLED display of claim 5, wherein the interlayer insulating layer has a top surface and a sidewall that form a taper angle with respect to each other, and wherein the taper angle is greater than about 30 degrees and less than about 80 degrees.

7. The OLED display of claim 2, wherein the source and drain electrodes do not directly contact the gate insulating layer.

8. The OLED display of claim 2, wherein the semiconductor, the gate insulating layer, the interlayer insulating layer, the gate electrode, the source electrode, and the drain electrode form a thin film transistor (TFT) positioned over the flexible portion.

9. The OLED display of claim 2, further comprising a display area including a plurality of pixels and a non-display area including a driver configured to generate and transmit a signal to drive the pixels, and wherein each of the pixels or the driver includes a thin film transistor comprising the semiconductor, the gate insulating layer, the interlayer insulating layer, the gate electrode, the source electrode, and the drain electrode.

10. The OLED display of claim 2, wherein the gate insulating layer includes:
    a first gate insulating layer positioned over the semiconductor; and
    a second gate insulating layer positioned over the first gate insulating layer.

11. The OLED display of claim 10, wherein the gate electrode is positioned between the first and second gate insulating layers.

12. The OLED display of claim 10, further comprising:
    a first capacitor electrode positioned between the first and second gate insulating layers; and
    a second capacitor electrode positioned over the second gate insulating layer and overlapping the first capacitor electrode in the depth dimension of the OLED display.

13. The OLED display of claim 10, wherein the opening includes:
    a first opening formed in the first gate insulating layer; and
    a second opening formed in the second gate insulating layer.

14. The OLED display of claim 13, wherein the second opening is larger than the first opening.

15. The OLED display of claim 10, wherein the interlayer insulating layer includes a contact hole positioned within the opening, and wherein the source and drain electrodes are connected to the semiconductor through the contact hole.

16. The OLED display of claim 15, wherein the interlayer insulating layer has a step shape within the contact hole.

17. The OLED display of claim 2, wherein the opening exposes at least part of an upper surface of the semiconductor and an entire side surface of the semiconductor.

18. The OLED display of claim 17, wherein the gate insulating layer has substantially the same shape as the gate electrode.

19. The OLED display of claim 17, wherein the gate insulating layer includes:
    a first gate insulating layer positioned over the semiconductor; and
    a second gate insulating layer positioned over the first gate insulating layer.

20. The OLED display of claim 19, wherein the gate electrode is positioned between the first gate insulating layer and the interlayer insulating layer.

21. The OLED display of claim 20, further comprising:
    a first capacitor electrode positioned between the first and second gate insulating layers; and
    a second capacitor electrode positioned over the second gate insulating layer and overlapping the first capacitor electrode in the depth dimension of the OLED display.

22. The OLED display of claim 21, wherein the first gate insulating layer has substantially the same shape as the gate electrode and the second capacitor electrode.

23. The OLED display of claim 21, wherein the second gate insulating layer has substantially the same shape as the second capacitor electrode.

24. The OLED display of claim 19, wherein the interlayer insulating layer has a contact hole positioned within the opening, and wherein the source and drain electrodes are connected to the semiconductor through the contact hole.

25. The OLED display of claim 24, wherein the interlayer insulating layer has a step shape within the contact hole.

26. An organic light-emitting diode (OLED) display, comprising;
    a flexible substrate;
    a semiconductor formed over the substrate and having a plurality of doped regions at opposing ends of the semiconductor;
    a gate insulating layer formed over the semiconductor;
    an interlayer insulating layer formed over the gate insulating layer; and
    a source electrode and a drain electrode formed over the interlayer insulating layer, wherein the interlayer insulating layer contacts the doped regions via a plurality of openings formed in the gate insulating layer, and wherein the source and drain electrodes respectively contact the doped regions via a plurality of contact holes formed in the interlayer insulating layer.

27. The OLED display of claim 26, wherein each of the contact holes has a width that increases as a function of distance from the semiconductor.

28. The OLED display of claim 27, wherein each of the openings has a width that increases as a function of distance from the semiconductor.

* * * * *